US006839272B2

(12) United States Patent
Ooishi

(10) Patent No.: US 6,839,272 B2
(45) Date of Patent: Jan. 4, 2005

(54) THIN FILM MAGNETIC MEMORY DEVICE CONDUCTING READ OPERATION AND WRITE OPERATION IN PARALLEL

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/353,986

(22) Filed: Jan. 30, 2003

(65) Prior Publication Data
US 2004/0037110 A1 Feb. 26, 2004

(30) Foreign Application Priority Data

Aug. 23, 2002  (JP) ...................................... 2002-243780

(51) Int. Cl.[7] .............................................. G11C 11/14
(52) U.S. Cl. ........................................ 365/171; 326/39
(58) Field of Search ............................. 365/171; 326/39

(56) References Cited

U.S. PATENT DOCUMENTS 6,314,020 B1    11/2001  Hansen et al. ............... 365/158
6,642,744 B2 *  11/2003  Or-Bach et al. ............... 326/39

OTHER PUBLICATIONS

Scheuerlein et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94,95, 128–129, 409–410.
Durlam et al., "Nonvolatile RAM based on Magnetic Tunnel Junction Elements", ISSCC Digest of Technical Papers, TA7.3, Feb. 2000, pp. 96–97, 130–131, 410–411.
Naji et al., "A 256kb 3.0V 1T1MTJ Nonvolatile Magnetoresistive RAM", ISSCC Digest of Technical Papers, TA7.6, Feb. 2001, pp. 94–95, 122–123, 404–405, 438.

* cited by examiner

Primary Examiner—M. Tran
(74) Attorney, Agent, or Firm—Burns, Doane, Swecker & Mathis, L.L.P.

(57) ABSTRACT

Bit lines are provided corresponding to columns of MTJ memory cells. Word lines serving as read selection lines and write digit lines serving as write selection lines are provided corresponding to rows of MTJ memory cells. A word line decoder and a digit line decoder are independently provided for the word lines and the write digit lines. The word line decoder selectively activates a word line according to a read address applied to a read port. The digit line decoder selectively activates a write digit line according to a write address applied to a write port.

12 Claims, 20 Drawing Sheets

THIN FILM MAGNETIC MEMORY DEVICE CONDUCTING READ OPERATION AND WRITE OPERATION IN PARALLEL

BACKGROUND OF THE INVENTION

1. Field of the Invention

The present invention generally relates to a thin film magnetic memory device. More particularly, the present invention relates to a thin film magnetic memory device including memory cells having a magnetic tunnel junction (MTJ).

2. Description of the Background Art

An MRAM (Magnetic Random Access Memory) device has attracted attention as a new-generation non-volatile memory device. The MRAM device is a non-volatile memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 21 schematically shows the structure of a memory cell having a magnetic tunnel junction (hereinafter, sometimes simply referred to as "MTJ memory cell").

Referring to FIG. 21, the MTJ memory cell includes a tunneling magneto-resistance element TMR and an access transistor ATR. Tunneling magneto-resistance element TMR has an electric resistance varying according to a magnetically written storage data level. Access transistor ATR is connected in series with tunneling magneto-resistance element TMR between a bit line BL and a source voltage line SL. Typically, a field effect transistor formed on a semiconductor substrate is used as access transistor ATR.

A bit line BL, a write digit line WDL, a word line WL and a source voltage line SL are provided for the MTJ memory cell. In write operation, data write currents of different directions are respectively applied to bit line BL and write digit line WDL. Word line WL is used to conduct read operation. In read operation, source voltage line SL pulls down tunneling magneto-resistance element TMR to a ground voltage GND. In read operation, tunneling magneto-resistance element TMR is electrically coupled between source voltage line SL and bit line BL in response to turning-ON of access transistor ATR.

FIG. 22 is a conceptual diagram illustrating write operation to the MTJ memory cell.

Referring to FIG. 22, tunneling magneto-resistance element TMR has a ferromagnetic material layer FL having a fixed magnetization direction (hereinafter, sometimes simply referred to as "fixed magnetic layer"), and a ferromagnetic material layer VL that is magnetized in the direction corresponding to an external magnetic field (hereinafter, sometimes simply referred to as "free magnetic layer"). A tunneling barrier (tunneling film) TB is formed between fixed magnetic layer FL and free magnetic layer VL. Tunneling barrier TB is formed from an insulator film. Free magnetic layer VL is magnetized either in the same direction as or in the opposite direction to that of fixed magnetic layer FL according to a write data level. Fixed magnetic layer FL, tunneling barrier TB and free magnetic layer VL form a magnetic tunnel junction.

The electric resistance of tunneling magneto-resistance element TMR varies according to the relation between the respective magnetization directions of fixed magnetic layer FL and free magnetic layer VL. More specifically, the electric resistance of tunneling magneto-resistance element TMR has a minimum value Rmin when fixed magnetic layer FL and free magnetic layer VL have the same (parallel) magnetization direction, and has a maximum value Rmax when they have opposite (antiparallel) magnetization directions.

In write operation, word line WL is inactivated and access transistor ATR is turned OFF. In this state, a data write current for magnetizing free magnetic layer VL is applied to each of bit line BL and write digit line WDL in a direction corresponding to the write data level.

FIG. 23 is a conceptual diagram showing the relation between the data write current and the magnetization direction of the tunneling magneto-resistance element in write operation.

Referring to FIG. 23, the abscissa H(EA) indicates a magnetic field which is applied to free magnetic layer VL of tunneling magneto-resistance element TMR in the easy-axis (EA) direction. The ordinate H(HA) indicates a magnetic field which is applied to free magnetic layer VL in the hard-axis (HA) direction. Magnetic fields H(EA), H(HA) respectively correspond to two magnetic fields generated by the currents flowing through bit line BL and write digit line WDL.

In the MTJ memory cell, fixed magnetic layer FL is magnetized in the fixed direction along the easy axis of free magnetic layer VL. Free magnetic layer VL is magnetized either in the direction parallel or antiparallel (opposite) to that of fixed magnetic layer FL along the easy axis according to the storage data level ("1" and "0"). The MTJ memory cell is thus capable of storing one-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 23. In other words, the magnetization direction of free magnetic layer VL does not change if the strength of an applied data write magnetic field corresponds to the region inside the asteroid characteristic line.

As shown by the asteroid characteristic line, applying a magnetic field of the hard-axis direction to free magnetic layer VL enables reduction in a magnetization threshold value required to change the magnetization direction along the easy axis. When the operation point of write operation is designed as in the example of FIG. 23, a data write magnetic field of the easy-axis direction is designed to have a strength $H_{WR}$ in the MTJ memory cell to be written. In other words, a data write current to be applied to bit line BL or write digit line WDL is designed to generate the data write magnetic field $H_{WR}$. In general, data write magnetic field $H_{WR}$ is given by the sum of a switching magnetic field Hsw required to switch the magnetization direction and a margin $\Delta H$. Data write magnetic field $H_{WR}$ is thus given by $H_{WR}=H_{SW}+\Delta H$.

In order to rewrite the storage data of the MTJ memory cell, that is, the magnetization direction of tunneling magneto-resistance element TMR, a data write current of a predetermined level or more must be applied to both write digit line WDL and bit line BL. Free magnetic layer VL in tunneling magneto-resistance element TMR is thus magnetized in the direction parallel or opposite (antiparallel) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another data write operation is conducted.

FIG. 24 is a conceptual diagram illustrating read operation from the MTJ memory cell.

Referring to FIG. 24, in read operation, access transistor ATR is turned ON in response to activation of word line WL. As a result, tunneling magneto-resistance element TMR is pulled down to ground voltage GND and electrically coupled to bit line BL.

If bit line BL is then pulled up to a predetermined voltage, a memory cell current Icell corresponding to the electric resistance of tunneling magneto-resistance element TMR, that is, the storage data level of the MTJ memory cell, flows through a current path including bit line BL and tunneling magneto-resistance element TMR. For example, the storage data can be read from the MTJ memory cell by comparing memory cell current Icell with a predetermined reference current.

A data read current flows through tunneling magneto-resistance element TMR in read operation. However, data read current Is is commonly designed to be about one to two orders smaller than the above data write current. Therefore, it is less likely that the storage data in the MTJ memory cell is erroneously rewritten due to the data read current Is in read operation. In other words, non-destructive read operation is possible.

FIGS. 25 and 26 illustrate the structure of an MTJ memory cell formed on a semiconductor substrate. FIG. 25 is a cross-sectional view of the MTJ memory cell and FIG. 26 is a top view thereof.

Referring to FIG. 25, an access transistor ATR formed on a semiconductor main substrate SUB has impurity regions (n-type regions) 310, 320 and a gate 330. Impurity region 310 is electrically coupled to a source voltage line SL through a metal film formed in a contact hole 341.

A write digit line WDL is formed in a metal wiring layer located above source voltage line SL. A tunneling magneto-resistance element TMR is provided in a layer located above write digit line WDL. Tunneling magneto-resistance element TMR is electrically coupled to impurity region 320 of access transistor ATR through a strap 350 and a metal film formed in a contact hole 340. Strap 350 is formed from a conductive material, and is provided in order to electrically couple tunneling magneto-resistance element TMR to access transistor ATR. A bit line BL is provided in a layer on tunneling magneto-resistance element TMR and is electrically coupled to tunneling magneto-resistance element TMR.

Bit line BL receiving a data write current and a data read current and write digit line WDL receiving a data write current are formed using a metal wiring layer. However, since word line WL is provided in order to control the gate voltage of access transistor ATR, it is not necessary to actively apply a current to word line WL. For improved integration, word line WL is commonly formed without using an additional independent metal wiring layer. In other words, word line WL is commonly formed in the same wiring layer as that of gate 330 by using a polysilicon layer or a polycide layer.

Referring to FIG. 26, write digit line WDL and bit line BL extend in such directions that cross each other. For example, if write digit line WDL and bit line BL are respectively provided along the directions of the easy axis (EA) and hard axis (HA) of tunneling magneto-resistance element TMR, magnetic fields H(HA), H(EA) of FIG. 23 are generated by the currents flowing through write digit line WDL and bit line BL. Accordingly, an MTJ memory cell to be written can be selected by selectively controlling supply of a data write current to each of write digit line WDL and bit line BL.

The MRAM device is thus capable of storing data in a non-volatile manner by using MTJ memory cells integrated on the semiconductor substrate. In each MTJ memory cell, the electric resistance of tunneling magneto-resistance element TMR varies according to the magnetization direction that is rewritable by an applied data write magnetic field. Accordingly, non-volatile data storage can be realized by using electric resistances Rmax, Rmin of tunneling magneto-resistance element TMR as the storage data levels ("1" and "0").

Some applications of a memory device require mixed operation of read and write operations. For example, a memory for storing information downloaded from a server or the like is required to read downloaded information as necessary while downloading information.

When a conventional EEPROM (Electrically Erasable Programmable Read-Only Memory) or so-called flash memory is used in such applications, a relatively long time is required for write operation (program operation). It is therefore necessary to provide a special buffer memory in addition to such a non-volatile memory in order to read data from the buffer memory as necessary while downloading the same information to the buffer memory and the non-volatile memory. The conventional non-volatile memory is not suitable for mixed operation of read and write operations like operation of reading and writing information in parallel.

An MRAM device having MTJ memory cells operate at a higher speed than the EEPROM and the flash memory. However, when the MRAM device is used in the above applications, the array structure is required which is suitable for efficient processing of mixed operation of read and write operations.

SUMMARY OF THE INVENTION

It is an object of the present invention to provide a thin film magnetic memory device having an array structure capable of rapidly conducting read operation and write operation in parallel.

According to one aspect of the present invention, a thin film magnetic memory device includes a memory cell array, a first port, a second port, and peripheral circuitry. The memory cell array includes a plurality of magnetic memory cells each holding magnetically written storage data. The first port receives a write address indicating a write selected memory cell which is selected for write operation in the memory cell array, and write data to the write selected memory cell. The second port receives a read address indicating a read selected memory cell which is selected for read operation in the memory cell array, and outputs read data from the read selected memory cell. The peripheral circuitry conducts read operation and write operation in parallel in the memory cell array based on the read address and the write address, respectively.

Accordingly, a main advantage of the present invention is that the thin film magnetic memory device is capable of implementing concurrent processing of read and write operations, i.e., capable of conducting read operation and write operation within the same cycle, by using the first port exclusively for write operation and the second port exclusively for read operation.

According to another aspect of the present invention, a thin film magnetic memory device includes a memory cell array, a first port, a second port, and peripheral circuitry. The memory cell array includes a plurality of magnetic memory cells arranged in a matrix. Each of the plurality of magnetic memory cells holds magnetically written storage data. The memory cell array further includes a plurality of read selection lines and a plurality of write selection lines which are provided corresponding to memory cell rows, a plurality of read bit lines provided corresponding to memory cell columns and each electrically coupled to magnetic memory cells of corresponding one of the memory cell columns, and a plurality of write bit lines provided corresponding to the memory cell columns and each not being electrically coupled to the plurality of magnetic memory cells. The first port receives a write address indicating a write selected memory cell which is selected for write operation in the memory cell array, and write data to the write selected memory cell. The second port receives a read address indicating a read selected memory cell which is selected for read operation in the memory cell array, and outputs read data from the read selected memory cell. The peripheral circuitry conducts read operation and write operation in parallel in the memory cell array based on the read address and the write address, respectively. The peripheral circuitry includes a data read circuit for reading the storage data from the read selected memory cell by using at least one of the plurality of read bit lines which is selected according to the read address, and a data write circuit for writing the write data to the write selected memory cell by using at least one of the plurality of write bit lines which is selected according to the write address.

In the above thin film magnetic memory device, read bit lines and write bit lines are independently provided. Therefore, the above thin film magnetic memory device is capable of implementing concurrent processing of read and write operations, i.e., capable of conducting read operation and write operation in parallel within the same cycle. Moreover, a read command and a write command which designate a memory cell group of the same bit line for read and write operations can be applied in parallel in the same cycle without complicating the structure and control of the peripheral circuitry.

According to still another aspect of the present invention, a thin film magnetic memory device includes a plurality of memory blocks, a first port, a second port, and peripheral circuitry. Each of the plurality of memory blocks includes a plurality of magnetic memory cells arranged in a matrix. Each of the plurality of magnetic memory cells holds magnetically written storage data. Each of the plurality of memory blocks is capable of independently conducting read operation or write operation. The first port receives write data and a write address indicating a write selected memory cell to which the write data is to be written in said memory cell array. The second port receives a read address indicating a read selected memory cell which is selected for read operation in the memory cell array, and outputs read data from the read selected memory cell. The peripheral circuitry is provided between the first and second ports and the plurality of memory blocks, and controls the read operation and the write operation in the plurality of memory blocks. The peripheral circuitry includes a transfer circuit for writing the read data or the write data corresponding to one of the plurality of memory blocks to another one of the plurality of memory blocks in response to a transfer command.

In the above thin film magnetic memory device, by executing the transfer command, backup data can be stored with improved efficiency when one of the plurality of memory blocks is used as a backup (mirror) memory block of another memory block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
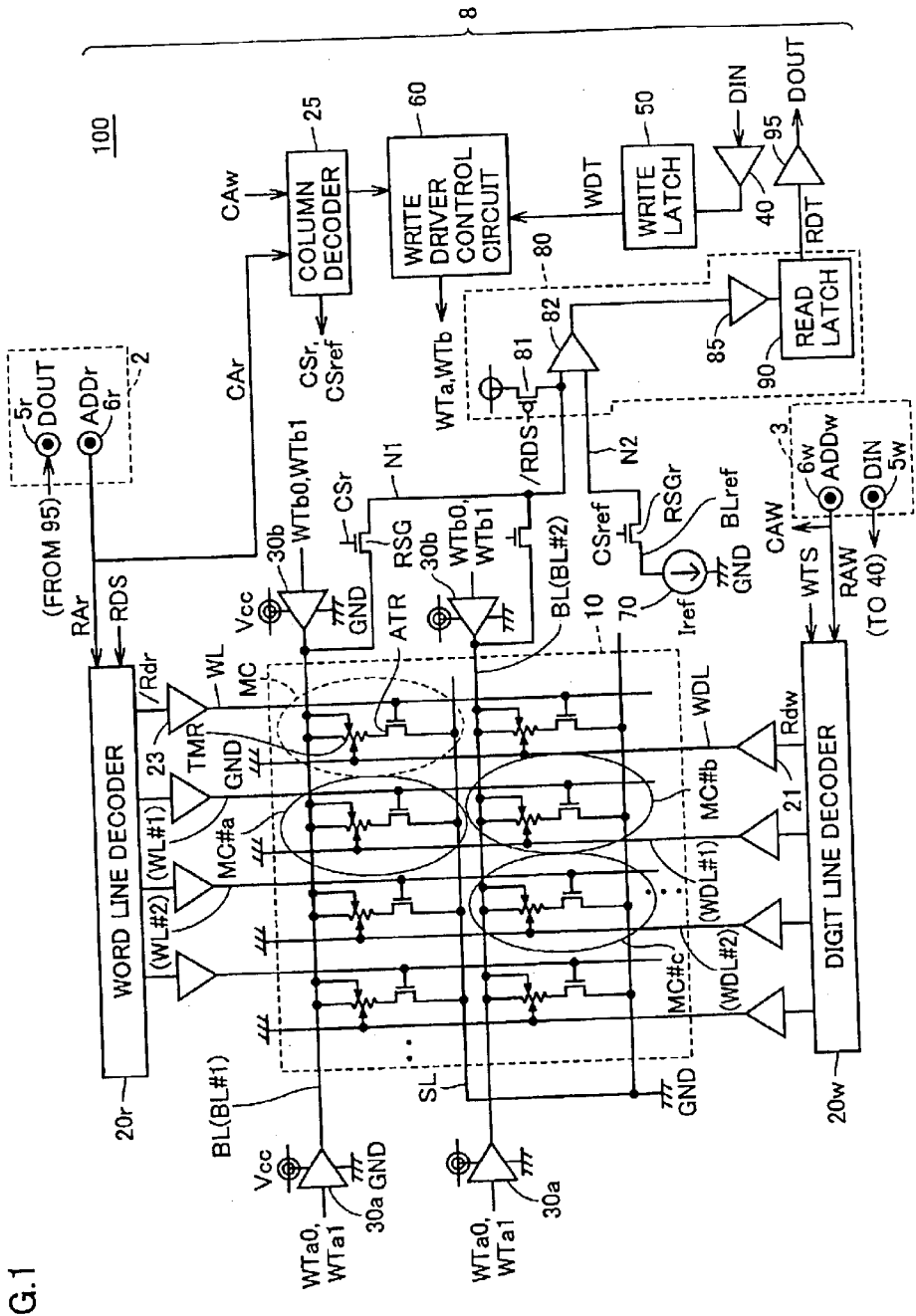
FIG. 1 is a block diagram showing the array structure of an MRAM device according to a first embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 100 of the first embodiment includes a read port 2, a write port 3, peripheral circuitry 8, and a memory cell array 10.

Memory cell array 10 has a plurality of MTJ memory cells MC arranged in a matrix. Word lines WL and write digit lines WDL are provided corresponding to MTJ memory cell rows (hereinafter, sometimes referred to as "memory cell rows"). Bit lines BL and source voltage lines SL are provided corresponding to MTJ memory cell columns (hereinafter, sometimes referred to as "memory cell columns").

Figure 21:
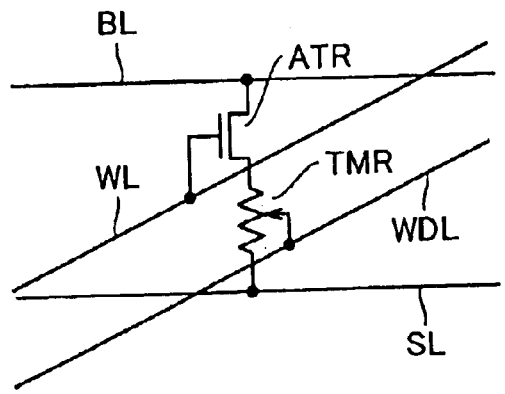
FIG. 21 schematically shows the structure of an MTJ memory cell.
Figure 22:
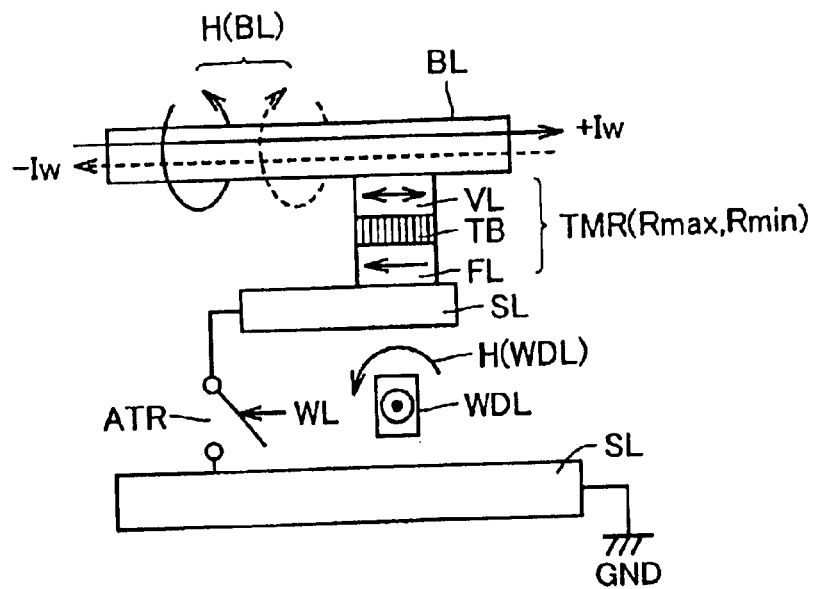
FIG. 22 is a conceptual diagram illustrating write operation to an MTJ memory cell.
Figure 23:
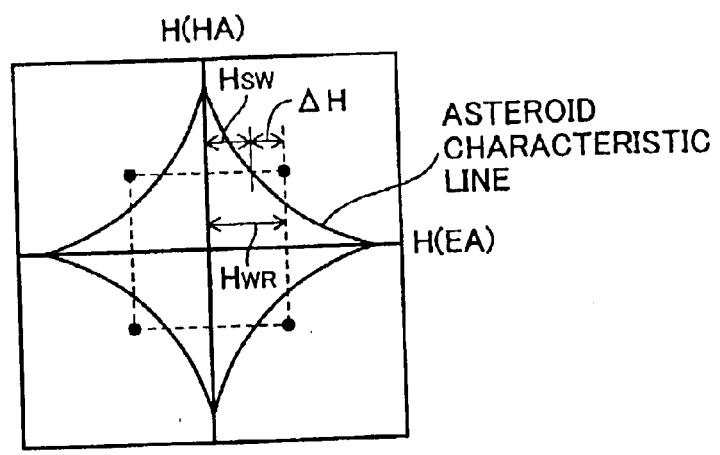
FIG. 23 is a conceptual diagram showing the relation between a data write current and a magnetization direction of a tunneling magneto-resistance element in write operation.
Figure 24:
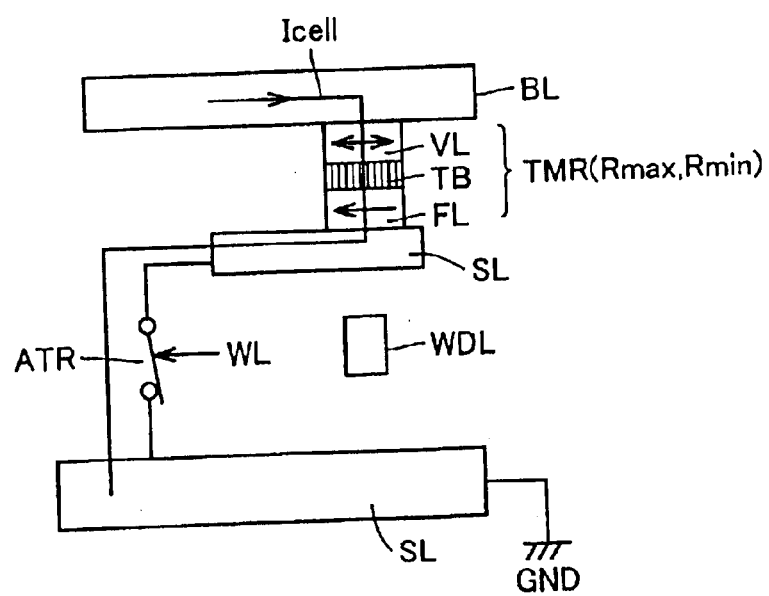
FIG. 24 is a conceptual diagram illustrating read operation from an MTJ memory cell.

Each MTJ memory cell MC has the same structure as that described in FIG. 21, and has a tunneling magneto-resistance element TMR and an access transistor ATR which are connected in series between a corresponding bit line BL and a corresponding source voltage line SL. Hereinafter, the MTJ memory cell is sometimes simply referred to as a memory cell.

As described before, tunneling magneto-resistance element TMR has an electric resistance corresponding to the magnetization direction. In other words, in each memory cell, tunneling magneto-resistance element TMR is magnetized in a predetermined direction in order to store H-level ("1") or L-level ("0") data. The electric resistance of tunneling magneto-resistance element TMR is thus set to Rmax or Rmin according to the storage data level.

Each source voltage line SL is coupled to a ground voltage GND. The source voltage of each access transistor ATR is therefore fixed to ground voltage GND. As a result, in a selected row (i.e., a row corresponding to a word line WL activated to H level), each tunneling magneto-resistance element TMR is pulled down to ground voltage GND and connected to a corresponding bit line BL.

Read port 2 has a data output terminal 5r and an address terminal 6r. A read address ADDr is applied to address terminal 6r. Storage data of a memory cell selected by read address ADDr (hereinafter, sometimes referred to as "read selected memory cell") is output from data output terminal 5r as output data DOUT.

Write port 3 has a data input terminal 5w and an address terminal 6w. A write address ADDw is applied to address terminal 6w. Input data DIN applied to data input terminal 5w is written to a memory cell selected by write address ADDw (hereinafter, sometimes referred to as "write selected memory cell").

Peripheral circuitry 8 collectively refers to a circuit group for conducting read operation and write operation from and to memory cell array 10. More specifically, peripheral circuitry 8 is a circuit group for reading output data DOUT from a read selected memory cell corresponding to read address ADDr and writing input data DIN to a write selected memory cell corresponding to write address ADDw.

Peripheral circuitry 8 includes a digit line decoder 20w, a word line decoder 20r, write digit line drivers 21, word line drivers 23, and a column decoder 25. Digit line decoder 20w and word line decoder 20r are separately provided for write digit lines WDL and word lines WL. Write digit line driver 21 is provided for each write digit line WDL, and word line driver 23 is provided for each word line WL.

Digit line decoder 20w selects a row in memory array 10 according to a write row address RAw indicated by write address ADDw. Word line decoder 20r selects a row in memory cell array 10 according to a read row address RAr indicated by read address ADDr.

Column decoder 25 receives a read column address CAr indicated by read address ADDr and a write column address CAw indicated by write address ADDw, and selects a column in memory cell array 10.

Digit line decoder 20w receives a write row address RAw indicated by write address ADDw and a control signal WTS, and generates a write row decode signal Rdw on a row-by-row basis. In a cycle in which write operation is designated, write row decode signal Rdw is activated to H level in a memory cell row selected according to write address ADDw (i.e. write row address RAw) (hereinafter, sometimes referred to as "write selected row"), and inactivated to L level in the other memory cell rows (hereinafter, sometimes referred to as "write non-selected rows"). On the other hand, in a cycle in which write operation is not designated, write row decode signal Rdw of each memory cell row is inactivated to L level. Write row decode signal Rdw is applied to write digit line driver 21 of a corresponding memory cell row.

Figure 2:
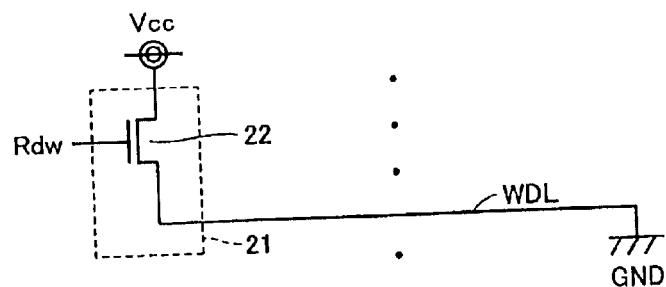
FIG. 2 is a circuit diagram showing the structure of a write digit line driver in FIG. 1.

Referring to FIG. 2, each write digit line driver 21 has a driver transistor 22 electrically coupled between one end of a corresponding write digit line WDL and a power supply voltage Vcc. Driver transistor 22 is an N-channel MOS (Metal Oxide Semiconductor) transistor, and receives write row decode signal Rdw of a corresponding memory cell row at its gate. As shown also in FIG. 1, the other end of each write digit line WDL is connected to ground voltage GND regardless of the address selection result.

Accordingly, in a cycle in which write operation is designated, driver transistor 22 is turned ON in the write selected row, and a data write current is applied to a corresponding write digit line WDL in the direction from write digit line driver 21 toward ground voltage GND. On the other hand, in each of the write non-selected rows, driver transistor 22 is turned OFF, and therefore no data write current is applied to a corresponding write digit line WDL.

In a cycle in which write operation is not designated, no data write current is applied to each write digit line WDL.

Referring back to FIG. 1, word line decoder 20r receives a read row address RAr indicated by read address ADDr and a control signal RDS, and generates a read row decode signal/Rdr on a row-by-row basis. In a cycle in which read operation is designated, read row decode signal/Rdr is activated to L level in a memory cell row selected according to read address ADDr (read row address RAr) (hereinafter, sometimes referred to as "read selected row"), and inactivated to H level in the other memory cell rows (hereinafter, sometimes referred to as "read non-selected rows"). On the other hand, in a cycle in which read operation is not indicated, read row decode signal/Rdr of each memory cell row is inactivated to H level. Read row decode signal/Rdr is applied to word line driver 23 of a corresponding memory cell row.

Figure 3:
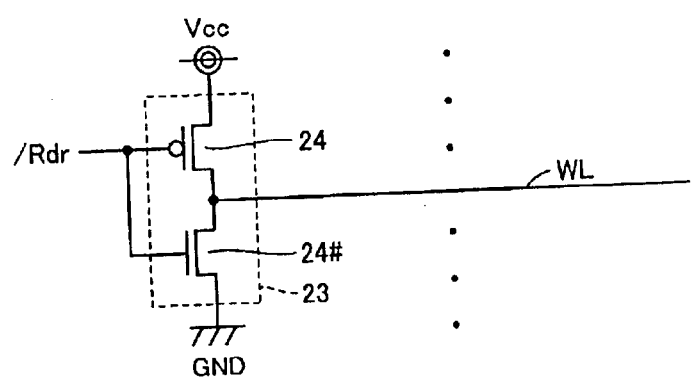
FIG. 3 is a circuit diagram showing the structure of a word line driver in FIG. 1.

Referring to FIG. 3, each word line driver 23 has driver transistors 24, 24# which are electrically coupled between one end of a corresponding word line WL and power supply voltage Vcc and ground voltage GND, respectively. Driver transistor 24 is a P-channel MOS transistor, and driver transistor 24# is an N-channel MOS transistor. Driver transistors 24, 24# receive read row decode signal/Rdr at their gates.

Accordingly, in a cycle in which read operation is designated, word line WL of a read selected row is connected to power supply voltage Vcc and activated, and word lines WL of read non-selected rows are connected to ground voltage GND and inactivated. On the other hand, in a cycle in which read operation is not designated, each word line WL is connected to ground voltage GND and inactivated.

Referring back to FIG. 1, peripheral circuitry 8 further includes bit line drivers 30a, 30b, an input buffer 40, a write latch circuit 50, and a write driver control circuit 60. Bit line drivers 30a, 30b are provided at both ends of each bit line BL, respectively. Input buffer 40 receives input data DIN. Write latch circuit 50 temporarily holds input data DIN received by input buffer 40. Write driver control circuit 60 controls operation of bit line drivers 30a, 30b based on write data WDT latched in write latch circuit 50.

Write driver control circuit 60 controls write control signals WTa0, WTa1, WTb0, WTb1 of each memory cell column according to write data WDT latched in write latch circuit 50 and the column selection result of column decoder 25.

Bit line driver 30a drives one end of a corresponding bit line BL with either power supply voltage Vcc or ground voltage GND according to write control signals WTa0, WTa1 of a corresponding memory cell column. Similarly, bit line driver 30b drives the other end of a corresponding bit line BL with either power supply voltage Vcc or ground voltage GND according to write control signals WTb0, WTb1 of a corresponding memory cell column.

Figure 4:
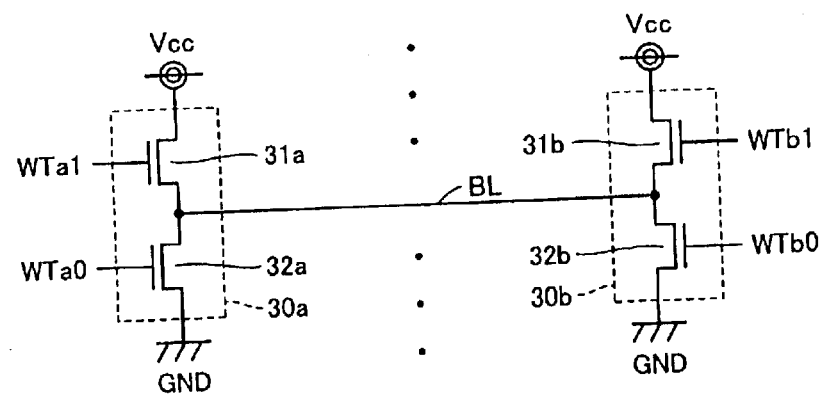
FIG. 4 is a circuit diagram showing the structure of a bit line driver in FIG. 1.

Referring to FIG. 4, each bit line driver 30a has driver transistors 31a, 32a which are electrically coupled between one end of a corresponding bit line BL and power supply voltage Vcc and ground voltage GND, respectively. Each bit line driver 30b has driver transistors 31b, 32b which are electrically coupled between the other end of a corresponding bit line BL and power supply voltage Vcc and ground voltage GND, respectively. In order to supply a sufficient write current with a small transistor size, an N-channel MOS transistor having relatively great current driving capability is used as driver transistors 31a, 32a, 31b, 32b.

Driver transistors 31a, 32a receive write control signals WTa1, WTa0 at their gates, and driver transistors 31b, 32b receive write control signals WTb1, WTb0 at their gates, respectively.

In a memory cell column selected according to write address ADDw (write column address CAw) (hereinafter, sometimes referred to as "write selected column"), one of write control signals WTa0, WTa1 which corresponds to input data DIN is set to H level, and the other write control signal WTa0, WTa1 is set to L level. Write control signals WTb0, WTb1 are set in a complementary manner to that of write control signals WTa0, WTa1. For example, when input data DIN is "1", write control signals WTa1, WTb0 are set to H level, and write control signals WTa0, WTb1 are set to L level. As a result, a data write current is applied to bit line BL of the write selected column in the direction from bit line driver 30a toward bit line driver 30b. On the other hand, when input data DIN is "0", write control signals WTa0, WTb1 are set to H level, and write control signals WTa1, WTb0 are set to L level. As a result, a data write current is applied to bit line BL of the write selected column in the direction from bit line driver 30b toward bit line driver 30a.

In the other memory cell columns (hereinafter, sometimes referred to as "write non-selected columns"), write control signals WTa0, WTa1, WTb0, WTb1 are set to L level. Accordingly, bit line drivers 30a, 30b of the write non-selected columns disconnect a corresponding bit line BL from power supply voltage Vcc and ground voltage GND.

A data write current flowing through a write digit line WDL generates a magnetic field along the hard-axis direction in a memory cell MC. A data write current flowing through a bit line BL in the direction corresponding to write data generates a magnetic field along the easy-axis direction in a memory cell MC. When a data write current is applied to both a write digit line WDL and a bit line BL, write data corresponding to the direction of the data write current flowing through the bit line BL is magnetically written to a corresponding memory cell MC. The same structure is provided for a bit line BL of each memory cell column. Note that the driving voltage of bit line drivers 30a, 30b may be a voltage other than ground voltage GND and power supply voltage Vcc.

Hereinafter, the structure in peripheral circuitry 8 which is associated with read operation will be described.

Referring back to FIG. 1, peripheral circuitry 8 further includes read selection gates RSG and a reference read selection gate RSGr. Each read selection gate RSG is provided between a corresponding bit line BL and a node N1. Reference read selection gate RSGr is provided between a node N2 and a reference bit line BLref. A read column decode signal CSr of a corresponding memory cell column is applied from column decoder 25 to the gate of each read selection gate RSG.

In a cycle in which read operation is designated, read column decode signal CSr is activated to H level in a memory cell column selected according to read address ADDr (read column address CAr) (hereinafter, sometime referred to as "read selected column"), and inactivated to L level in the other memory cell columns (hereinafter, sometimes referred to as "read non-selected columns"). On the other hand, in a cycle in which read operation is not designated, read column decode signal CSr is inactivated to L level in each memory cell column.

Peripheral circuitry 8 further includes a data read circuit 80. Data read circuit 80 includes a current supply transistor 81, sense amplifiers 82, 85, and a read latch circuit 90. Current supply transistor 81 supplies a read current to node N1. Sense amplifier 82 amplifies the difference between a current flowing through node N1 and a current flowing through node N2. Sense amplifier 85 amplifies the output of sense amplifier 82. Read latch circuit 90 latches the output of sense amplifier 85 at a predetermined timing and generates read data RDT.

Current supply transistor 81 is electrically coupled between power supply voltage Vcc and node N1, and receives a control signal/RDS at its gate.

As described before, in a cycle in which read operation is designated, word line WL of a read selected row is activated (to H level), and each bit line BL is pulled down to ground voltage GND through tunneling magneto-resistance elements TMR. Accordingly, in a cycle in which read operation is designated, a read selected memory cell is accessed and a current I(Rmax) or I(Rmin) corresponding to the electric resistance (Rmax or Rmin) of the read selected memory cell flows through node N1 in response to turning-ON of current supply transistor 81.

Reference bit line BLref is pulled down to ground voltage GND through a reference current generator 70 for supplying a reference current Iref. A control signal CSref is applied to the gate of reference read selection gate RSGr. Control signal CSref is activated to H level in a cycle in which read operation is designated. Reference current Iref is a constant current which is preset to an intermediate level of currents I(Rmax) and I(Rmin) flowing through node N1. Accordingly, in a cycle in which read operation is designated, node N2 is connected to reference bit line BLref, and reference current Iref flows through node N2.

Sense amplifiers 82, 85 sense and amplify the difference between a read current flowing through node N1, i.e., a current flowing through the read selected memory cell, and reference current Iref flowing through node N2, storage data can be read from the read selected memory cell.

In view of the time required for amplifying operation of sense amplifiers 82, 85, read latch circuit 90 latches an output voltage of sense amplifier 85 at the timing the output voltage of sense amplifier 85 reaches an amplitude of a predetermined level or more. Read latch circuit 90 thus generates read data RDT.

Figure 5:
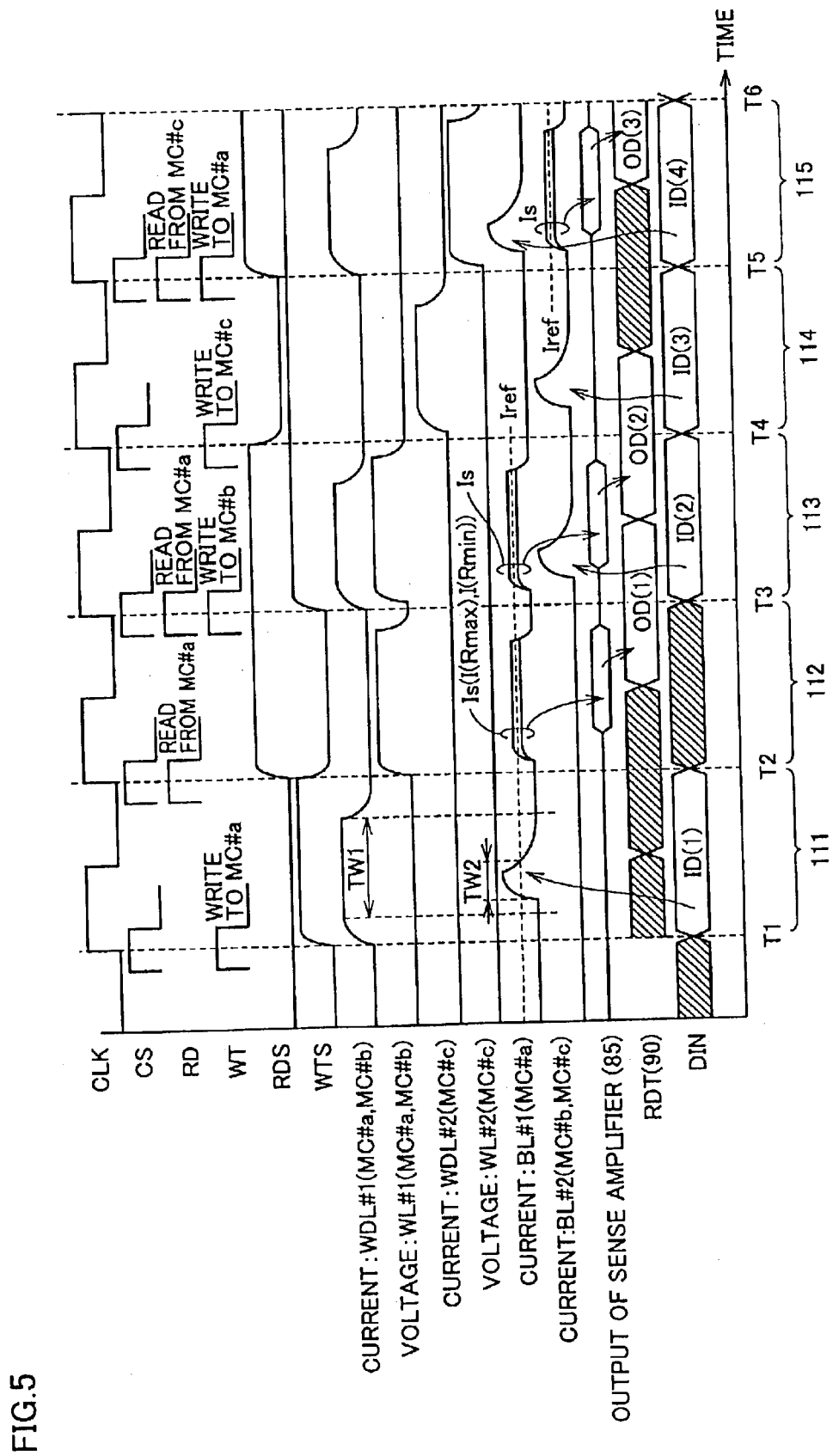
FIG. 5 is a waveform chart specifically illustrating read operation and write operation in the MRAM device of the first embodiment.

Hereinafter, read operation and write operation in the MRAM device of the first embodiment will be specifically described with reference to the waveform chart of FIG. 5. FIG. 5 shows an example in which memory cells MC#a, MC#b, MC#c of FIG. 1 are selected for read operation or write operation.

As shown in FIG. 1, a word line WL#1 and a write digit line WDL#1 correspond to memory cells MC#a, MC#b of the same memory cell row. A word line WL#2 and a write digit line WDL#2 correspond to memory cell MC#c. A bit line BL#1 corresponds to memory cell MC#a, and a bit line BL#2 corresponds to memory cells MC#b, MC#c of the same memory cell column.

Referring to FIG. 5, a clock signal CLK is repeatedly activated to H level and inactivated to L level on a predetermined cycle. The rising edges of clock signal CLK correspond to times T1 to T6, and corresponding clock cycles are denoted by cycles 111 to 115.

When an operation instruction to MRAM device 100 is applied, a chip select signal CS is activated to H level at the rising edge of clock signal CLK at the start of a corresponding cycle. When a write command (instruction to conduct write operation) is applied, chip select signal CS and command control signal WT are activated to H level at the rising edge of clock signal CLK at the start of a corresponding cycle. Similarly, when a read command (instruction to conduct read operation) is applied, chip select signal CS and command control signal RD are activated to H level at the rising edge of clock signal CLK at the start of a corresponding cycle.

Control signal RDS is set to H level in a cycle in which read operation is designated, and set to L level in the other cycles. Similarly, control signal WTS is set to H level in a cycle in which write operation is designated, and set to L level in the other cycles.

A write command to conduct write operation to memory cell MC#a is applied at time T1. Accordingly, although not shown in the figure, write address ADDw designating memory cell MC#a (write selected memory cell) is applied to address terminal 6w. Data ID(1) corresponding to write data to memory cell MC#a is fetched from data input terminal 5w as input data DIN and held in write latch circuit 50 of FIG. 1.

In cycle 111, in response to the write command, write address and write data which are fetched at time T1, a data write current of a predetermined direction is applied to write digit line WDL#1 corresponding to memory cell MC#a, and a data write current of the direction corresponding to data ID(1) is applied to bit line BL#1 by corresponding bit line drivers 30a, 30b. As a result, data ID(1) is written to memory cell MC#a.

A period TW2 of supplying a data write current to the selected bit line (BL#1) is included in a period TW1 of supplying a data write current to the selected write digit line (WDL#1), and is shorter than period TW1. In other words, application of a magnetic field of the easy-axis direction from bit line BL#1 to the memory cell selected for write operation (memory cell MC#a) is started and completed during application of a magnetic field of the hard-axis direction from write digit line WDL#1 to the selected memory cell (memory cell MC#a). By thus reducing the current supply period to the selected bit line, the amount of data write current can be suppressed in the case where data is written to a plurality of memory cells.

The following cycle starts at time T2. A read command to conduct read operation to memory cell MC#a is applied at time T2. Accordingly, although not shown in the figure, read address ADDr designating memory cell MC#a (read selected memory cell) is applied to address terminal 6r.

In response to this, in cycle 112, control signal RDS is activated to H level and word line WL#1 corresponding to memory cell MC#a is activated to H level. Current supply transistor 81 is turned ON in response to control signal/RDS (inverted signal of control signal RDS). As a result, a read current Is is applied to bit line BL#1 corresponding to memory cell MC#a. As described before, read current Is is equal to I(Rmax) or I(Rmin) according to the storage data of selected memory cell MC#a.

Sense amplifiers 82, 85 conduct read operation by comparing read current Is on the selected bit line (BL#1) with reference current Iref. Sense amplifiers 82, 85 amplify read data to effective amplitude during cycle 112. Read data RDT latched in read latch circuit 90 becomes valid from this point of time (data OD(1)). Accordingly, from time T3 (corresponding to the following rising edge of clock signal CLK), data OD(1) read from memory cell MC#a can be output from data output terminal 5r as output data DOUT.

The following cycle 113 starts at time T3. A read command to conduct read operation from memory cell MC#a and a write command to conduct write operation to memory cell MC#b are simultaneously applied at time T3. Memory cell MC#a (read selected memory cell) and memory cell MC#b (write selected memory cell) are both located in the same memory cell row, and correspond to different bit lines BL#1, BL2#, respectively. Note that, in the structure of the first embodiment, a memory cell group corresponding to the same bit line cannot be selected for read and write operations by a read command and a write command which are applied in the same cycle.

At time T3, read address ADDr designating memory cell MC#a, write address ADDw designating memory cell MC#b, and data ID(2) corresponding to write data to memory cell MC#b are fetched together with the read command and the write command.

In cycle 113, control signals RDS, WTS are set to H level, and write digit line WDL#1 and word line WL#1 are both activated. Moreover, read selection gate RSG corresponding to bit line BL#1 is turned ON, and bit line BL#1 is connected to node N1. Since node N1 is coupled to power supply voltage Vcc by current supply transistor 81, a read current Is corresponding to storage data of memory cell MC#a flows through bit line BL#1.

Data read circuit 80 generates data OD(2) corresponding to storage data of memory cell MC#a based on read current Is flowing through bit line BL#1. At time T4(corresponding to the following rising edge of clock signal CLK), data OD(2) is output from data output terminal 5r as output data DOUT.

On the other hand, bit line BL#2 corresponding to memory cell MC#b receives a data write current of the direction corresponding to data ID(2) by corresponding bit line drivers 30a, 30b. As a result, data ID(2) is written to memory cell MC#b according to the direction of the data write current on bit line BL#2.

By thus independently selecting write line WL and write digit line WDL, read operation and write operation can be conducted in parallel in cycle 113 in memory cells MC#a, MC#b corresponding to different bit lines BL.

The following cycle 114 starts at time T4. A write command to conduct write operation to a memory cell MC#c is applied at time T4. In other words, write address ADDw designating memory cell MC#c is applied to address terminal 6w. Moreover, data ID(3) corresponding to write data to memory cell MC#c (write selected memory cell) is fetched from data input terminal 5w as input data DIN.

In cycle 114, in response to the write command, write address and write data which are fetched at time T4, a data write current of a predetermined direction is applied to write digit line WDL#2 corresponding to memory cell MC#c, and a data write current of the direction corresponding to data ID(3) is applied to bit line BL#2 by corresponding bit line drivers 30a, 30b. As a result, data ID(3) is written to memory cell MC#c.

The following cycle 115 starts at time T5. A read command to conduct read operation to memory cell MC#c and a write command to conduct write operation to memory cell MC#a are simultaneously applied at time T5. Memory cells MC#a (write selected memory cell) and MC#c (read selected memory cell) correspond to different memory cell rows and different memory cell columns.

At time T5, read address ADDr designating memory cell MC#c, write address ADDw designating memory cell MC#a, and data ID(4) corresponding to write data to memory cell MC#a are fetched together with the read command and the write command.

In cycle 115, control signals RDS, WTS are set to H level, and write digit line WDL#1 and word line WL#2 are activated. Moreover, read selection gate RSG corresponding to bit line BL#2 is turned ON, and bit line BL#2 is connected to node N1. Since node N1 is coupled to power supply voltage Vcc by current supply transistor 81, a read current Is corresponding to storage data of memory cell MC#c flows through bit line BL#2.

Data read circuit 80 generates data OD(3) corresponding to storage data of memory cell MC#c based on read current Is flowing through bit line BL#2. At time T6(corresponding to the following rising edge of clock signal CLK), data OD(3) is output from data output terminal 5r as output data DOUT.

On the other hand, bit line BL#1 corresponding to memory cell MC#a receives a data write current of the direction corresponding to input data ID(4) by corresponding bit line drivers 30a, 30b. As a result, data ID(4) is written to memory cell MC#a according to the direction of the data write current on bit line BL#1.

In this way, read operation from memory cell MC#c and write operation to memory cell MC#a can be conducted in parallel in cycle 115.

As has been described above, in the MRAM device of the first embodiment, a read port and a write port are separately provided in order to independently receive a write address ADDw designating a write selected memory cell and a read address ADDr designating a read selected memory cell. Moreover, decode circuits are separately provided for word lines WL and write digit lines WDL. This enables read operation and write operation to be conducted in parallel in the same cycle except the case where the read selected memory cell and the write selected memory cell are connected to the same bit line. In other words, concurrent processing of read and write operations can be implemented.

Modification of First Embodiment

The structure described in the modification of the first embodiment is capable of designating a memory cell group corresponding to the same bit line as memory cells designated by a read command and a write command which are applied in the same cycle.

Figure 6:
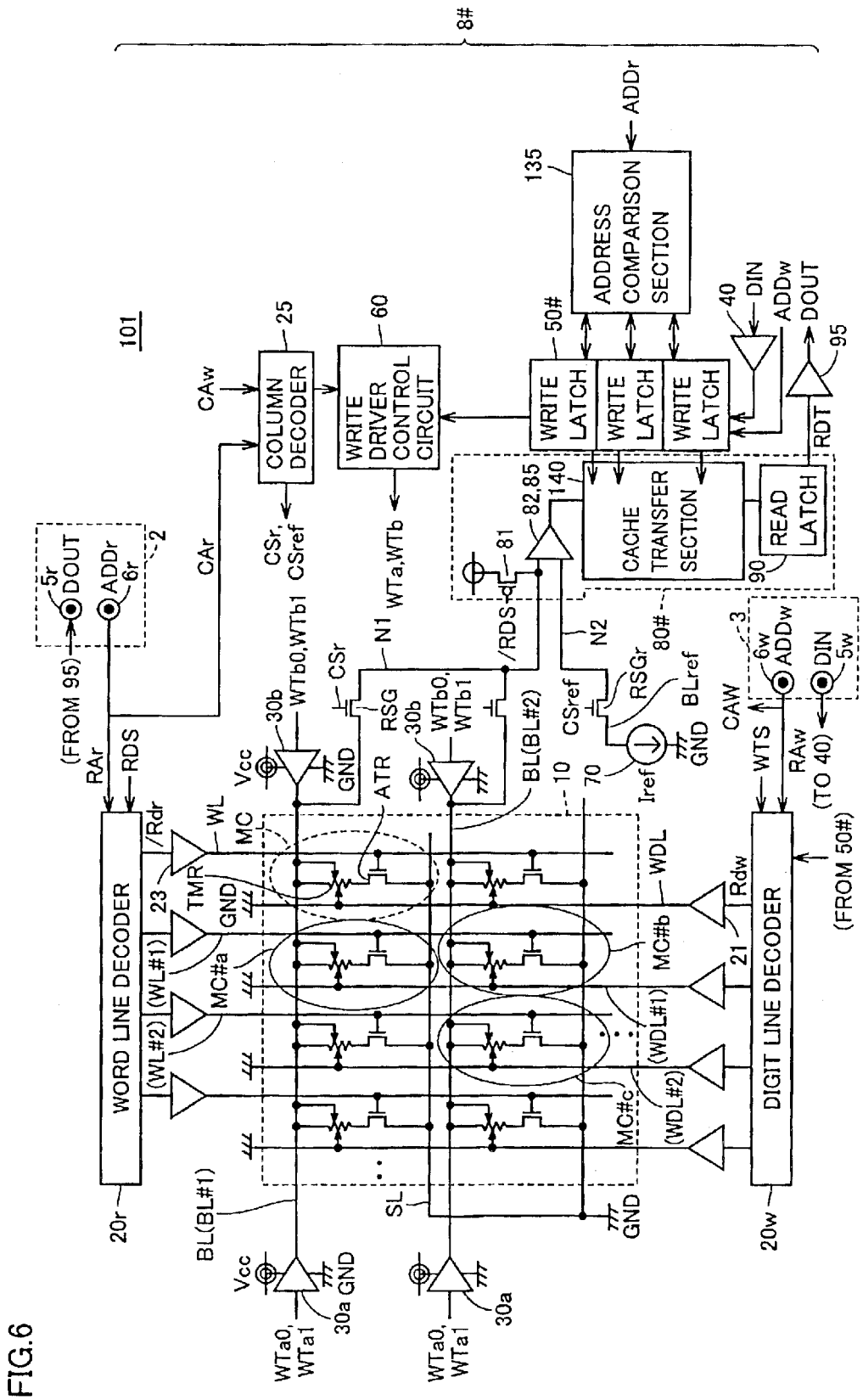
FIG. 6 is a block diagram showing the array structure of an MRAM device according to a modification of the first embodiment of the present invention.

Referring to FIG. 6, an MRAM device 101 of the modification of the first embodiment is different from MRAM device 100 of the first embodiment in that peripheral circuitry 8 is replaced with peripheral circuitry 8#. Peripheral circuitry 8# is different from peripheral circuitry 8 of FIG. 1 in that data read circuit 80 is replaced with a data read circuit 80#, write latch circuit 50 is replaced with a write latch circuit 50#, and peripheral circuitry 8# further includes an address comparison section 135. Data read circuit 80# is different from data read circuit 80 of FIG. 1 in that data read circuit 80# further includes a cache transfer section 140.

In MRAM device 101, when a read command and a write command are applied in parallel in the same cycle and a read selected memory cell and a write selected memory cell correspond to the same bit line, the read command is preferentially executed. Write driver control circuit 60 postpones write operation corresponding to the write command to a cycle in which the bit line required for the write operation is no longer used in the read operation.

Write data and write address ADDw which correspond to the postponed write operation are temporarily held in write latch circuit 50#. Write latch circuit 50# is capable of storing a plurality of sets of input data DIN and write address ADDw by a FIFO (First In First Out) method.

Address comparison section 135 compares write address ADDw temporarily held in write latch circuit 50# with a newly received read address ADDr in order to determine whether or not write address ADDw matches read address ADDr. In other words, address comparison section 135 is provided in order to detect that an address, which is held in write latch circuit 50# and corresponds to write data which has not been written to memory cell array 10, is selected for read operation by a newly received read address ADDr.

Cache transfer section 140 is provided between sense amplifiers 82, 85 and read latch circuit 90. In response to an instruction from address comparison section 135, cache transfer section 140 transfers write data WDT, which is held in write latch circuit 50# and has not been written to memory cell array 10, to read latch circuit 90 as read data.

As a result, if an address, which is held in write latch circuit 50# and corresponds to write data which has not been written to memory cell array 10, is selected for read operation by a newly applied read address ADDr, this write data is copied to cache transfer section 140 and applied to read latch circuit 90 as read data RDT. In this case as well, the postponed write operation is conducted in a later cycle.

In this way, a read command and a write command which designate a memory cell group corresponding to the same bit line for read and write operations can be applied in parallel in the same cycle.

Since the structure of MRAM device 101 according to the modification of the first embodiment is otherwise the same as that of MRAM device 100 of FIG. 1, detailed description thereof will not be repeated.

Figure 7:
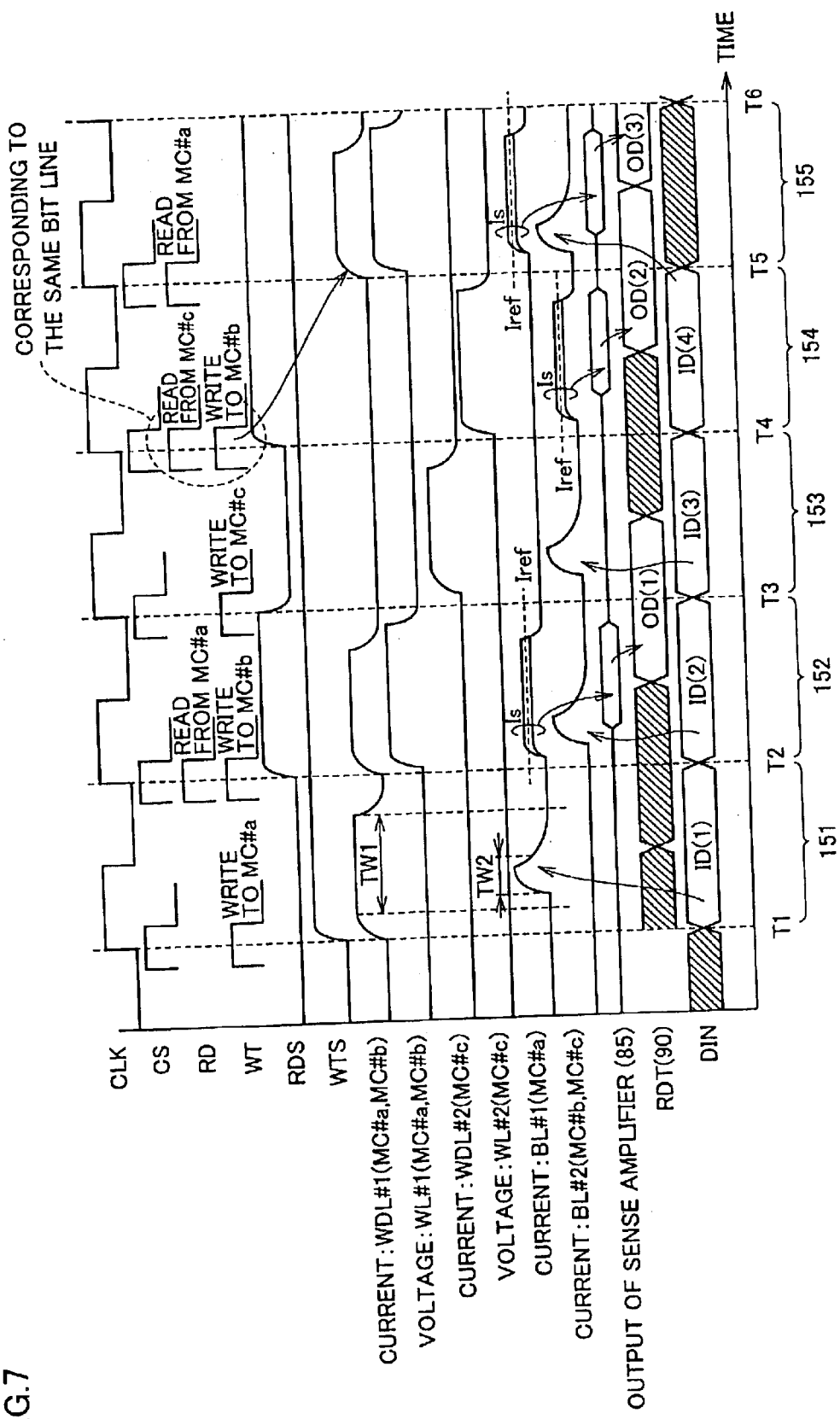
FIG. 7 is a waveform chart specifically illustrating write operation and read operation in the MRAM device according to the modification of the first embodiment.

FIG. 7 is a waveform chart specifically illustrating write operation and read operation in the MRAM device according to the modification of the first embodiment.

Referring to FIG. 7, in cycle 151, a write command to write data ID(1) to memory cell MC#a is applied as in cycle 111 of FIG. 5. In response to this, as in cycle 111 of FIG. 5, a data write current is applied to write digit line WDL#1 and bit line BL#1, whereby data ID(1) is written to memory cell MC#a (write selected memory cell).

In the following cycle 152, a read command to conduct read operation from memory cell MC#a and a write command to conduct write operation to memory cell MC#b are applied in parallel as in cycle 113 of FIG. 5. Memory cells MC#a, MC#b are located in the same memory cell row, and correspond to different memory cell columns (bit lines).

In cycle 152, word line WL#1 and write digit line WDL#1 respectively corresponding to memory cells MC#a (read selected memory cell) and MC#b (write selected memory cell) are activated as in cycle 113 of FIG. 5. Moreover, storage data of memory cell MC#a is read as data OD(1) based on a read current Is flowing through corresponding bit line BL#1. From time T3(corresponding to the following rising edge of clock signal CLK), data OD(1) can be output as output data DOUT.

On the other hand, a data write current corresponding to write data is applied to bit line BL#2 corresponding to memory cell MC#b, and data ID(2) is written to memory cell MC#b.

In the following cycle 153, a write command to conduct write operation to memory cell MC#c is applied and write data ID(3) to memory cell MC#c is fetched, as in cycle 114 of FIG. 5. In response to this, a data write current is applied to write digit line WDL#2 and bit line BL#2, and data ID(3) is written to memory cell MC#c (write selected memory cell).

In cycle 154, a read command to conduct read operation from memory cell MC#c and a write command to conduct write operation to memory cell MC#b are applied in parallel. Memory cells MC#c (read selected memory cell) and MC#b (write selected memory cell) correspond to the same bit line. In such a case, write operation corresponding to the write command is postponed to a later cycle, and only read operation is conducted in cycle 154.

Accordingly, in cycle 154, word line WL#2 corresponding to memory cell MC#c is activated to H level, and storage data of memory cell MC#c is read as data OD(2) based on a read current Is flowing through bit line BL#2. From time T5(corresponding to the following rising edge of clock signal CLK), data OD(2) can be output as output data DOUT.

Although write data ID(4) to memory cell MC#b is applied at time T4, this write data ID(4) is temporarily held in write latch circuit 50# of FIG. 6 together with write address ADDw designating memory cell MC#b.

In the following cycle 155, a read command to conduct read operation from memory cell MC#a is applied. Memory cell MC#a to be read in this cycle and memory cell MC#b to be written in the postponed write operation correspond to different bit lines. Therefore, the postponed write operation is conducted in parallel with the read operation in cycle 155.

In cycle 155, word line WL#1 corresponding to memory cell MC#a is activated to H level, and storage data of memory cell MC#a is read as data OD(3) based on a read current Is flowing through bit line. BL#1. From time T6 (corresponding to the following rising edge of clock signal CLK), data OD(3) can be output as output data DOUT.

Based on write data ID(4) and write address ADDw which are held in write latch circuit 50#, write digit line WDL#1 corresponding to memory cell MC#b is activated. Moreover, a data write current of the direction corresponding to data ID(4) is applied to bit line BL#2 by corresponding bit line drivers 30a, 30b.

In this way, the postponed write operation corresponding to the write command applied in cycle 154 and the read operation corresponding to the read command applied in cycle 155 are conducted in parallel in cycle 155. Like the MRAM device of the first embodiment, the MRAM device of the modification of the first embodiment is thus capable of implementing concurrent processing of read and write operations. In addition, the MRAM device of the modification of the first embodiment is capable of applying a read command and a write command which designate a memory cell group corresponding to the same bit line in parallel in the same cycle.

Second Embodiment

In the array structure described in the second embodiment, bit lines are provided separately for read operation and write operation in order to enable implementation of concurrent processing of read and write operations.

Figure 8:
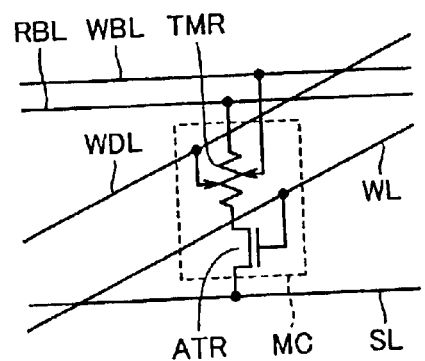
FIG. 8 is a circuit diagram showing arrangement of a signal line group provided for a memory cell in an MRAM device according to a second embodiment of the present invention.

Referring to FIG. 8, a read bit line RBL and a write bit line WBL are independently provided in the second embodiment. Read bit line RBL is used exclusively for read operation, and corresponds to bit line BL of FIG. 21. Write bit line WBL receives a data write current. Write bit line WBL is provided along the same direction as that of read bit line RBL. In write operation, write bit line WBL receives a data write current of the direction corresponding to a write data level. Write bit line WBL is not electrically coupled to tunneling magneto-resistance element TMR. However, a current flowing through write bit line WBL generates a magnetic field in the direction along the easy axis of tunneling magneto-resistance element TMR. Since word line WL, write digit line WDL and source voltage line SL are provided in the same manner as that of FIG. 21, detailed description thereof will not be repeated.

Figure 9:
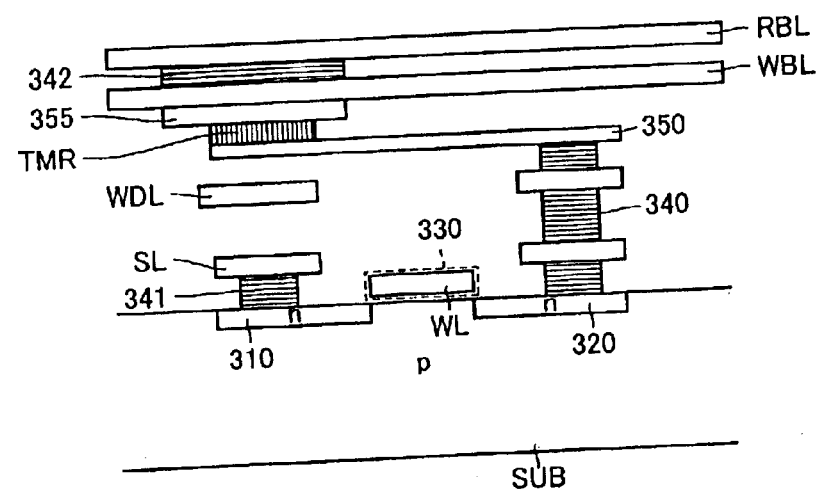
FIG. 9 is a cross-sectional view of the memory cell structure in the MRAM device of the second embodiment.
Figure 10:
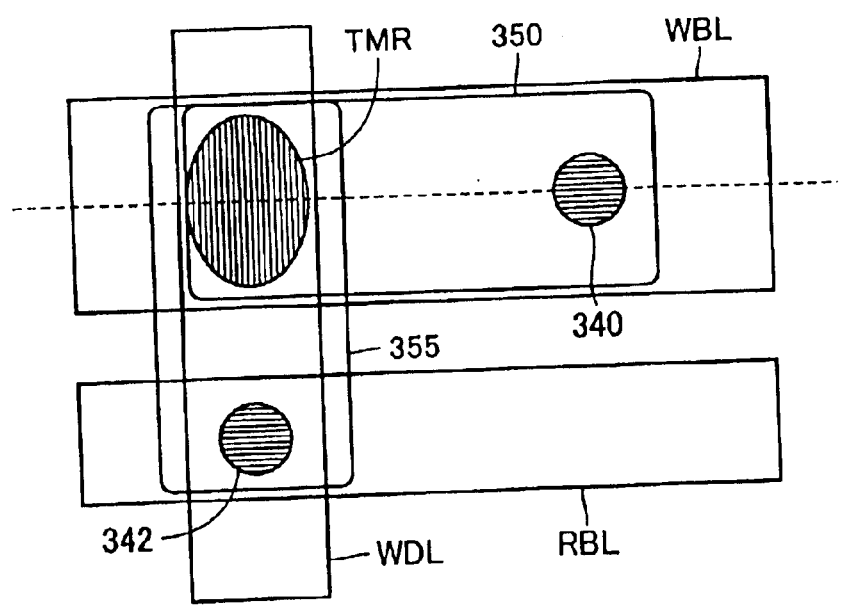
FIG. 10 is a top view of the memory cell structure in the MRAM device of the second embodiment.

FIGS. 9 and 10 show the memory cell structure in the MRAM device of the second embodiment. FIG. 9 is a cross-sectional view of the memory cell structure, and FIG. 10 is a top view thereof.

In the example of FIGS. 9 and 10, read bit line RBL is formed in a metal wiring layer located above write bit line WBL. However, read bit line RBL and write bit line WBL may alternatively be formed in the same metal wiring layer.

In order to efficiently apply a data write magnetic field generated by write bit line WBL to tunneling magneto-resistance element TMR, the distance between write bit line WBL and tunneling magneto-resistance element TMR is designed to be shorter than the distance between read bit line RBL and tunneling magneto-resistance element TMR.

Figure 25:
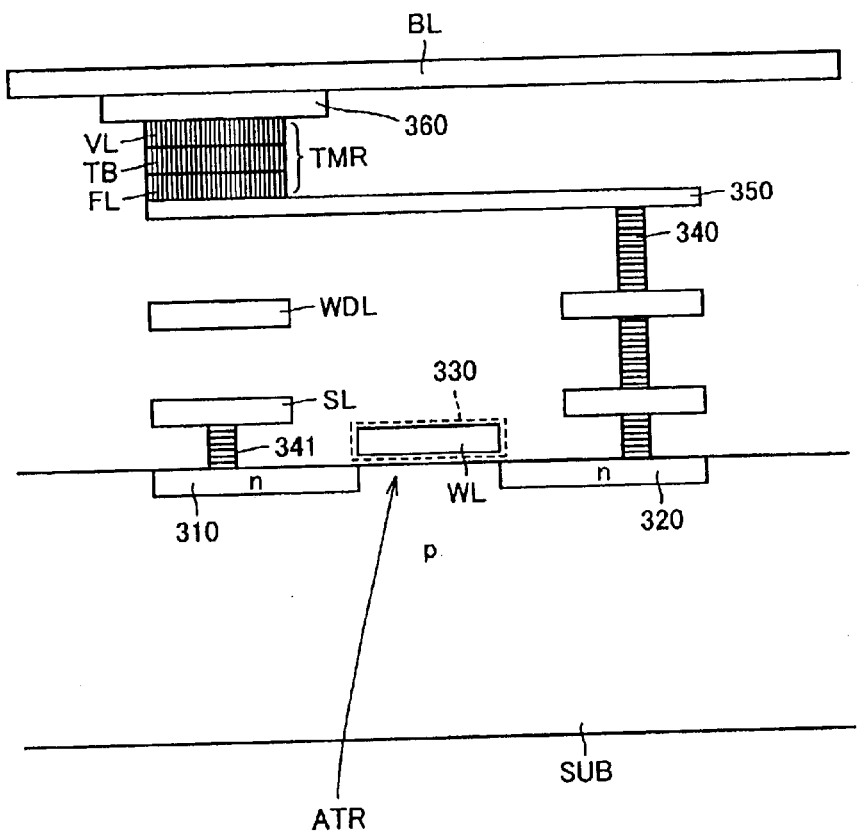
FIG. 25 is a cross-sectional view illustrating the structure of an MTJ memory cell formed on a semiconductor substrate.
Figure 26:
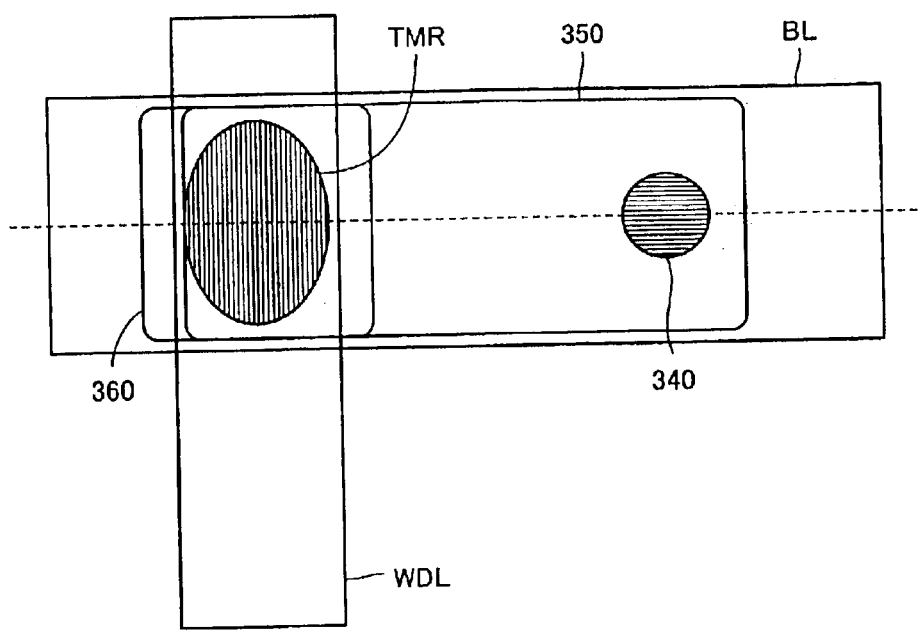
FIG. 26 is a top view illustrating the structure of the MTJ memory cell formed on the semiconductor substrate.

Read bit line RBL is electrically coupled to tunneling magneto-resistance element TMR through a strap 355 and a metal film formed in a via hole 342. On the other hand, write bit line WBL is provided near tunneling magneto-resistance element TMR, but is not electrically coupled to tunneling magneto-resistance element TMR. Since the memory cell structure is otherwise the same as that shown in FIGS. 25 and 26, detailed description thereof will not be repeated.

In this way, write bit line WBL, which is provided in order to apply a data write magnetic field of a predetermined level or more to a memory cell selected for write operation, is provided near the MTJ memory cell (tunneling magneto-resistance element TMR). This suppresses the amount of data write current required for write operation, thereby enabling reduction in power consumption.

Figure 11:
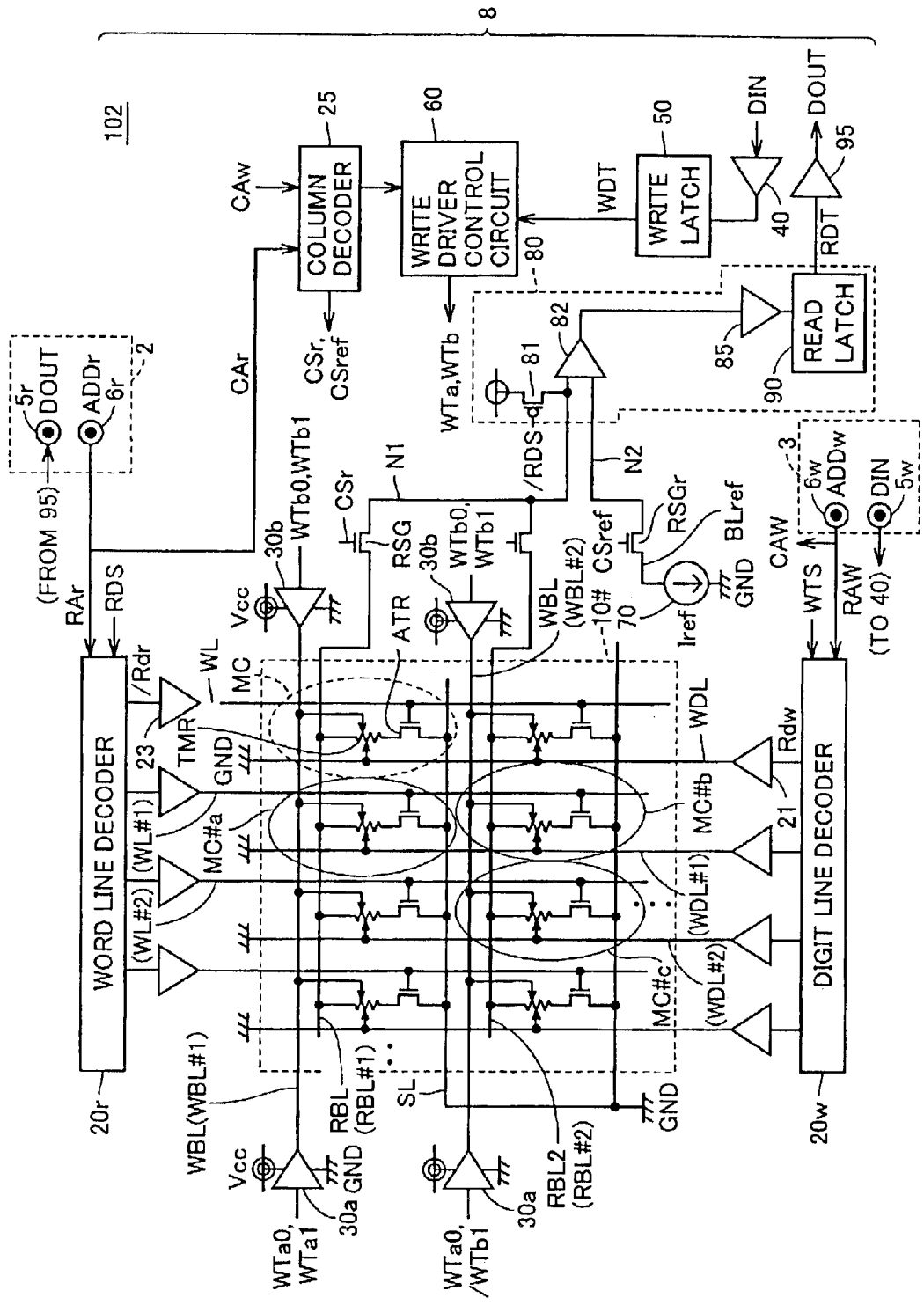
FIG. 11 is a block diagram showing the overall structure of the MRAM device of the second embodiment.

Referring to FIG. 11, an MRAM device 102 of the second embodiment includes a read port 2, a write port 3, peripheral circuitry 8, and a memory cell array 10#. Memory cell array 10# has a plurality of memory cells of FIGS. 8 to 10 arranged in a matrix. In other words, in memory cell array 10#, word lines WL and write digit lines WDL are provided corresponding to the memory cell rows, and read bit lines RBL, write bit lines WBL and source voltage lines SL are provided corresponding to the memory cell columns.

Since the structure of read port 2, write port 3 and peripheral circuitry 8 is the same as that in MRAM device 100 of FIG. 1, detailed description thereof will not be repeated. In peripheral circuitry 8, however, bit line drivers 30a, 30b are provided at both ends of each write bit line WBL, respectively, and read selection gate RSG is provided between each read bit line RBL and node N1.

In each of the write non-selected columns, bit line drivers 30a, 30b connect both ends of a corresponding write bit line WBL to ground voltage GND. In other words, unlike the structure of the first embodiment, write control signals WTa0, WTb0 are set to H level and write control signals WTa1, WTb1 are set to L level in the write non-selected columns. This stabilizes the state of write bit lines WBL of the write non-selected columns, thereby enabling stabilization of operation.

Figure 12:
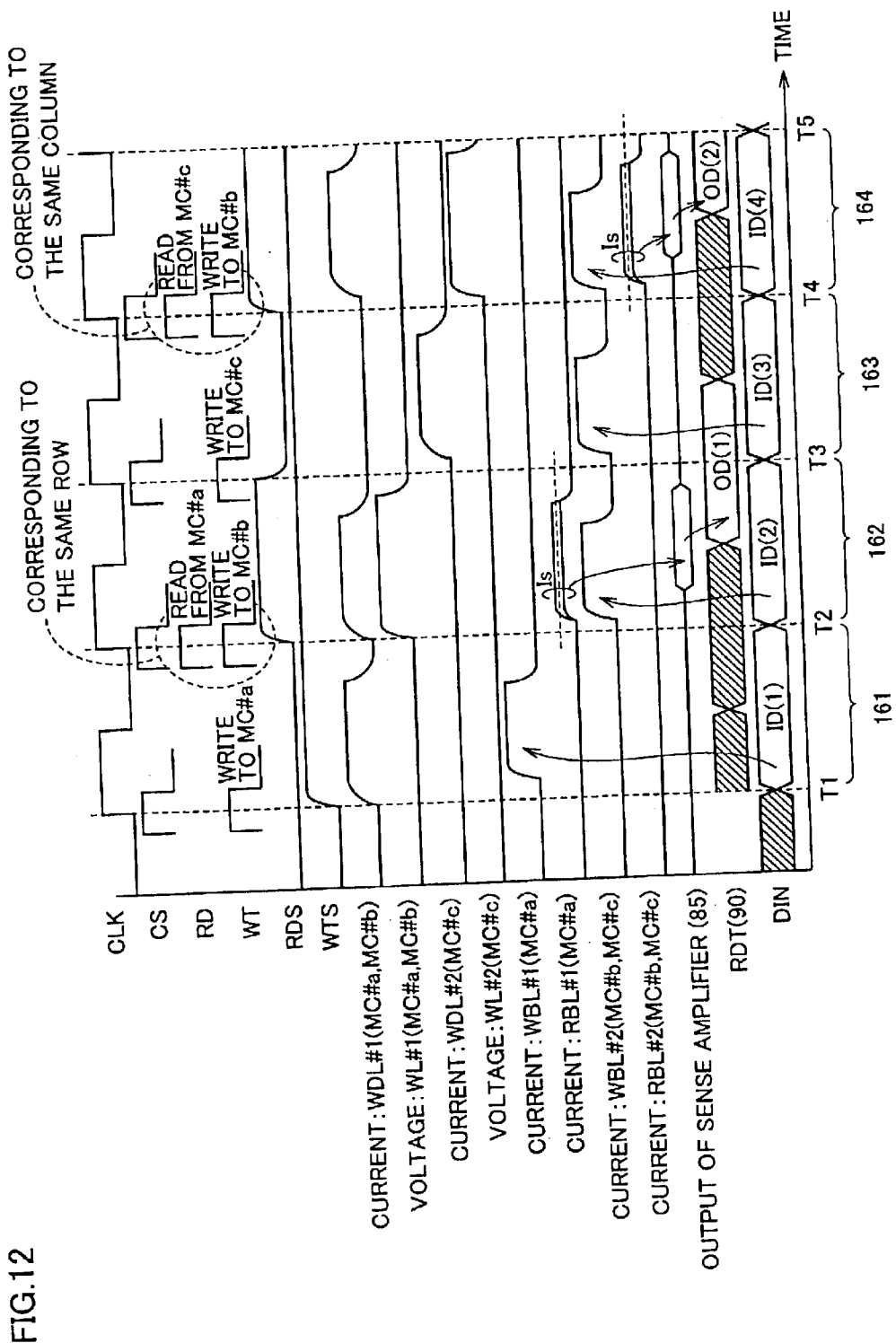
FIG. 12 is a waveform chart specifically illustrating read operation and write operation in the MRAM device of the second embodiment.

FIG. 12 is a waveform chart specifically illustrating read operation and write operation in the MRAM device of the second embodiment. FIG. 12 shows an example in which memory cells MC#a, MC#b, MC#c of FIG. 11 are selected for read operation or write operation.

As shown in FIG. 11, a write bit line WBL#1 and a read bit line RBL#1 correspond to memory cell MC#a. A write bit line WBL#2 and a read bit line RBL#2 correspond to memory cells MC#b, MC#c of the same memory cell column.

Referring to FIG. 12, in cycle 161, a write command to write data ID(1) to memory cell MC#a (write selected memory cell) is applied as in cycle 151 of FIG. 7. In response to this, a data write current is applied to write digit line WDL#1 and write bit line WBL#1, whereby data ID(1) is written to memory cell MC#a.

In the following cycle 162, a read command to conduct read operation from memory cell MC#a (read selected memory cell) and a write command to conduct write operation to memory cell MC#b (write selected memory cell) are applied in parallel as in cycle 152 of FIG. 7. Memory cells MC#a, MC#b are located in the same memory cell row, and correspond to different memory cell columns.

In cycle 162, word line WL# corresponding to memory cell MC#a and write digit line WDL#1 corresponding to memory cell MC#b are activated. Word line WL#1 and write digit line WDL#1 correspond to the same row. Storage data of memory cell MC#a is then read as data OD(1) based on a read current Is flowing through read bit line RBL#1 corresponding to memory cell MC#a. From time T3(corresponding to the following rising edge of clock signal CLK), data OD(1) can be output as output data DOUT. Moreover, a data write current corresponding to write data is applied to write bit line WBL#2 corresponding to memory cell MC#b, whereby data ID(2) is written to memory cell MC#b.

In the following cycle 163, a write command to conduct write operation to memory cell MC#c (write selected memory cell) is applied and write data ID(3) to memory cell MC#c is fetched as in cycle 153 of FIG. 7. In response to this, a data write current is applied to write digit line WDL#2 and write bit line WBL#2, whereby data ID(3) is written to memory cell MC#c.

In cycle 164, a read command to conduct read operation from memory cell MC#c (read selected memory cell) and a write command to conduct write operation to memory cell MC#b (write selected memory cell) are applied in parallel as in cycle 154 of FIG. 7. Memory cells MC#b, MC#c correspond to the same memory cell column.

In cycle 164, word line WL#2 corresponding to memory cell MC#c and write digit line WDL#1 corresponding to memory cell MC#b are activated. Storage data of memory cell MC#c is then read as data OD(2) based on a read current Is flowing through read bit line RBL#2 corresponding to memory cell MC#c. From time T5 (corresponding to the following rising edge of clock signal CLK), data OD(2) can be output as output data DOUT. Moreover, a data write current corresponding to write data is applied to write bit line WBL#1 corresponding to memory cell MC#b, whereby data ID(4) is written to memory cell MC#b.

In this way, even if a read command and a write command which respectively designate memory cells of the same memory cell column for read and write operations are applied in the same cycle, the read command and the write command can be processed in parallel during this cycle without requiring a special structure and special operation for postponing execution of the write command.

Like the MRAM device of the first embodiment, the MRAM device of the second embodiment is thus capable of implementing concurrent processing of read and write operations. In addition, in the MRAM device of the second embodiment, read bit lines and write bit lines are provided independently. This allows a read command and a write command which designate a memory cell group of the same bit line for read and write operations to be applied in parallel in the same cycle without complicating the structure and control of the peripheral circuitry.

Third Embodiment

The memory cell array capable of implementing concurrent processing of read and write operations is described in the first and second embodiments. In the third embodiment, the structure of the MRAM device is described which is capable of implementing concurrent processing of read and write operations in the whole MRAM device by combining array structures each capable of conducting only one of read and write operations in each cycle.

Figure 13:
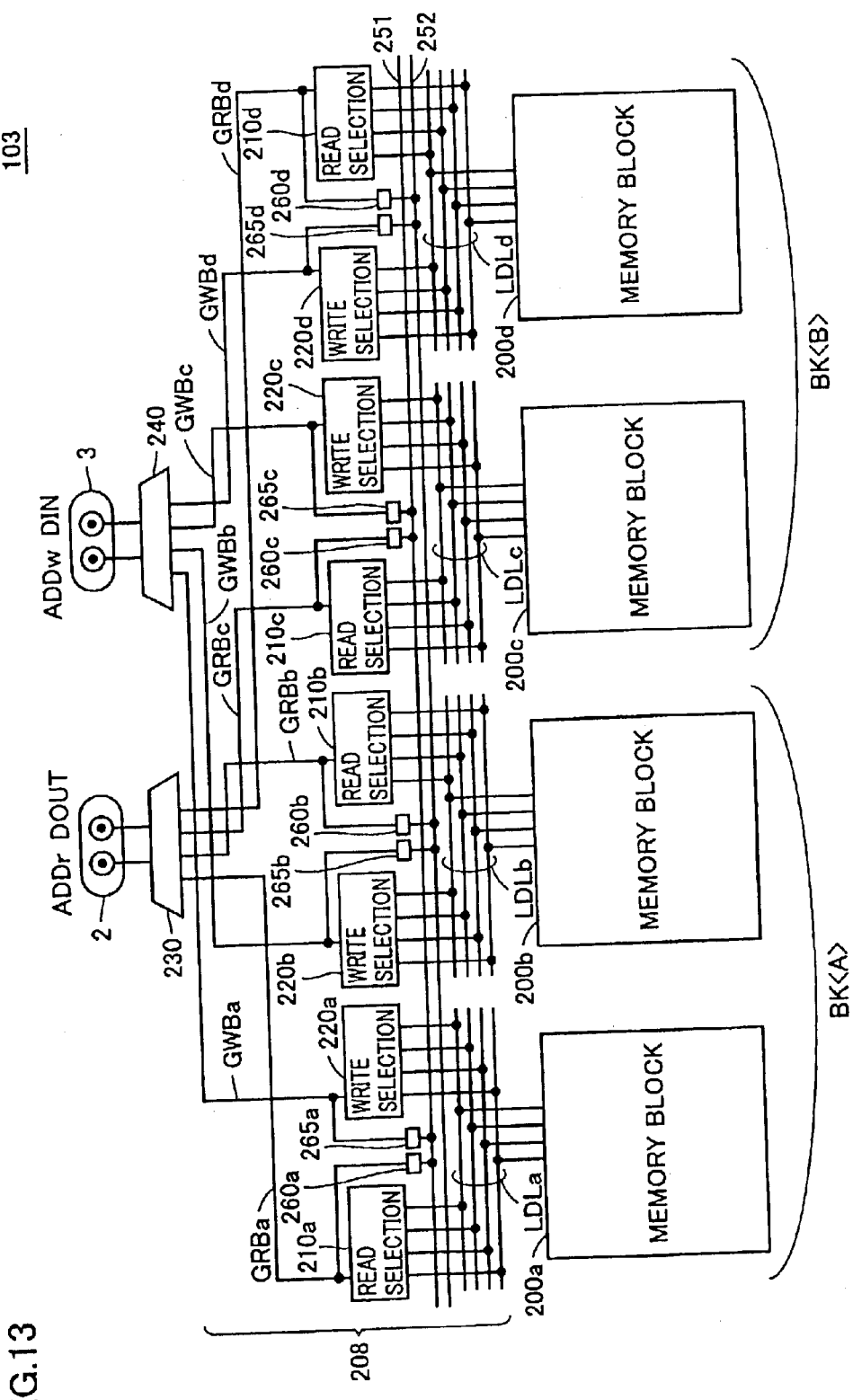
FIG. 13 is a schematic block diagram showing the overall structure of an MRAM device according to a third embodiment of the present invention.

Referring to FIG. 13, an MRAM device 103 of the third embodiment includes a read port 2, a write port 3, a plurality of memory blocks 200a to 200d, and peripheral interface circuitry 208. Peripheral interface circuitry 208 transmits data between read port 2 and write port 3 and memory blocks 200a to 200d.

Each memory block 200a to 200d can conduct only one of read and write operations in each cycle. An example of such a memory block can be implemented by integrating word line decoder 20r and digit line decoder 20w in the array structure of MRAM device 100 into a common decode circuit so that word line WL is selectively activated in read operation and write digit line WDL is selectively activated in write operation based on the decode result of the common decode circuit.

Memory blocks 200a to 200d are divided into two banks BK<A>, BK<B>. Bank BK<A> is formed by memory blocks 200a, 200b, and bank BK<B> is formed by memory blocks 200c, 200d. It is now assumed that N-bit data can be read and written in each memory block 200a to 200d (where N is a natural number), and the number of memory blocks per bank is L (where L is a natural number; in FIG. 13, L=2). In this case, the number of bits M which can be simultaneously read and written in the whole MRAM device 103 by using read port 2 and write port 3 is given by M=L×N (where M is a natural number).

Peripheral interface circuitry 208 includes local data lines LDLa to LDLd, global read buses GRBa to GRBd, global write buses GWBa to GWBd, read selection circuits 210a to 210d, write selection circuits 220a to 220d, and selectors 230, 240. Local data lines LDLa to LDLd, global read buses GRBa to GRBd, and global write buses GWBa to GWBd are provided corresponding to memory blocks 200a to 200d. Read selection circuits 210a to 210d are provided between global read buses GRBa to GRBd and local data lines LDLa to LDLd, respectively. Write selection circuits 220a to 220d are provided between global write buses GWBa to GWBd and local data lines LDLa to LDLd, respectively. Selector 230 is provided between read port 2 and global read buses GRBa to GRBd. Selector 240 is provided between write port 3 and global write buses GWBa to GWBd.

The following description is given on the assumption that one-bit data is read and written in each memory block 200a to 200d (i.e., N=1). In a memory block of a bank designated for read operation or write operation, one of corresponding local data lines is selected and used for read operation and write operation.

Peripheral interface circuitry 208 further includes transfer data buses 251, 252. Transfer data bus 251 bi-directionally transmits data between memory blocks 200a, 200c. Transfer data bus 252 bi-directionally transmits data between memory blocks 200b, 200d. Peripheral interface circuitry 208 further includes transfer switches 260a, 260b, 260c, 260d. Transfer switch 260a is provided between transfer data bus 251 and global read bus GRBa. Transfer switch 260b is provided between transfer data bus 252 and global read bus GRBb. Transfer switch 260c is provided between transfer data bus 251 and global read bus GRBc. Transfer switch 260d is provided between transfer data bus 252 and global read bus GRBd.

Peripheral interface circuitry 208 further includes transfer switches 265a, 265b, 265c, 265d. Transfer switch 265a is provided between transfer data bus 251 and global write bus GWBa. Transfer switch 265b is provided between transfer data bus 252 and global write bus GWBb. Transfer switch 265c is provided between transfer data bus 251 and global write bus GWBc. Transfer switch 265d is provided between transfer data bus 252 and global write bus GWBd.

Read port 2 receives a read address ADDr, and outputs output data DOUT. Read address ADDr is used for a read command which designates one of banks BK<A>, BK<B> for read operation. Write port 3 receives a write address ADDw and input data DIN. Write address ADDw is used for a write command which designates one of banks BK<A>, BK<B> for write operation.

MRAM device 103 of the third embodiment additionally receives a transfer command. A transfer command is a command to write read data or write data of one of banks BK<A>, BK<B> to the other bank. As described in detail below, a bank from which data is to be transferred in response to a transfer command (hereinafter, sometimes referred to as "transferring bank") and a bank to which data is to be transferred in response to a transfer command (hereinafter, sometimes referred to as "transferred bank") are designated within the MRAM device based on a read bank address indicated by read address ADDr or a write bank address indicated by write address ADDw. This eliminates the need for a port for receiving a bank address corresponding to a transfer command.

Figure 14:
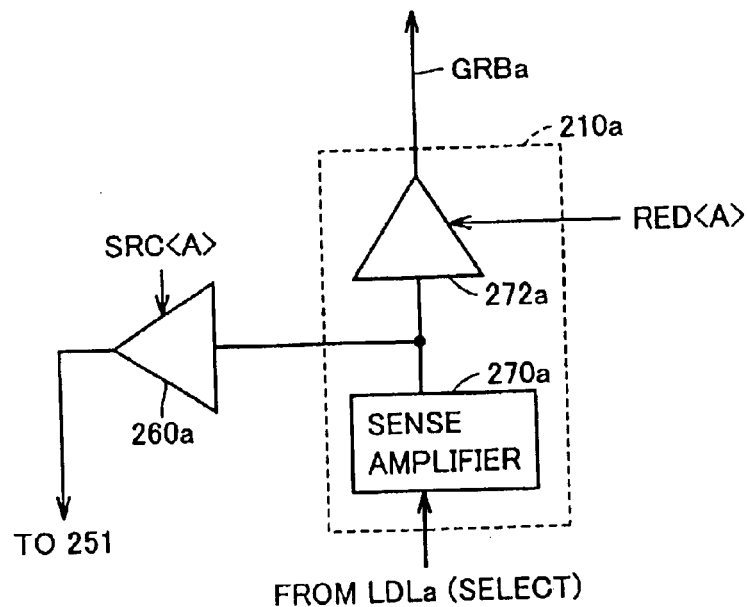
FIG. 14 is a block diagram showing the structure of a read selection circuit in FIG. 13.

FIG. 14 is a block diagram of a read selection circuit.

FIG. 14 exemplarily shows the structure of read selection circuit 210a corresponding to memory block 200a.

As described before, when bank BK<A> is selected, one of local data lines LDLa and one of local data lines LDLb are selected, and one-bit data is read in each of memory blocks 200a, 200b. As a result, a total of 2-bit read data is output from read port 2.

Read selection circuit 210a includes a sense amplifier 270a and a transfer switch 272a. Sense amplifier 270a is selectively connected to one of local data lines LDLa, and amplifies read data on the selected local data line. Alternatively, sense amplifier 270a may be provided for each local data line LDLa so that the outputs of the plurality of sense amplifiers 270a can be selectively output.

Transfer switch 272a transfers the output of sense amplifier 270a to global read bus GRBa in response to a bank control signal RED<A>. Bank control signal RED<A> is activated when a read command designating bank BK<A> is executed.

Transfer switch 260a transmits the output of sense amplifier 270a to transfer data bus 251 in response to a bank control signal SRC<A>. Bank control signal SRC<A> is activated to H level when a transfer command designating bank BK<A> as a transferring bank is executed. Since read selection circuits 210b to 210d and transfer switches 260b to 260d corresponding to memory blocks 200b to 200d have the same structure as that of FIG. 14, detailed description thereof will not be repeated.

Figure 15:
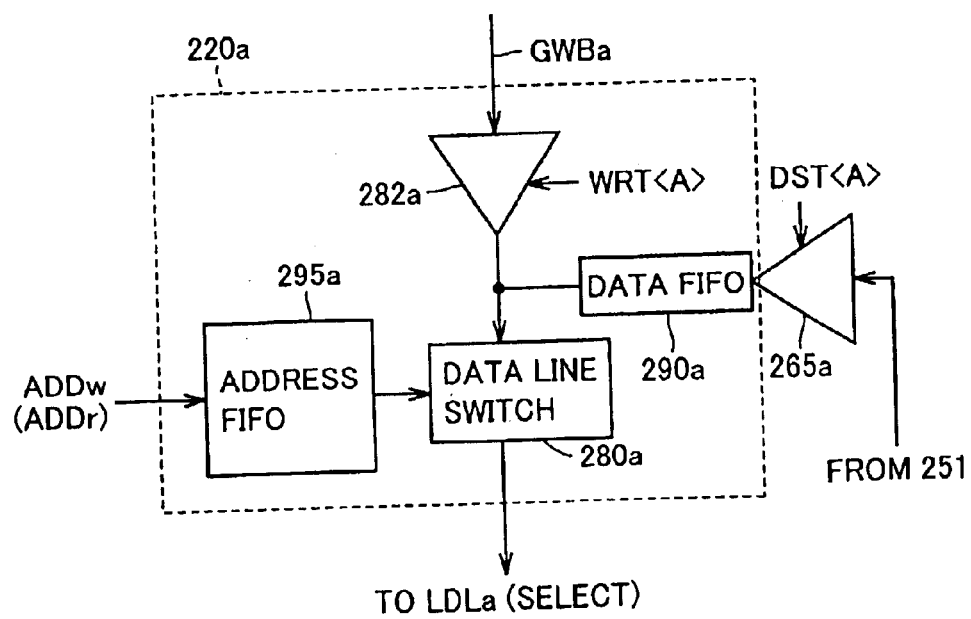
FIG. 15 is a block diagram showing the structure of a write selection circuit in FIG. 13.

FIG. 15 is a block diagram of a write selection circuit.

FIG. 15 exemplarily shows the structure of write selection circuit 220a corresponding to memory block 200a.

Referring to FIG. 15, write selection circuit 220a includes a data line switch 280a, a transfer switch 282a, a data buffer 290a, and an address buffer 295a.

Transfer switch 265a transmits data on transfer data bus 251 to data buffer 290a in response to a bank control signal DST<A>. Bank control signal DST<A> is activated when a transfer command designating bank BK<A> as a transferred bank is executed. Transfer switch 282a transmits data on global write bus GWBa to data line switch 280a in response to a bank control signal WRT<A>. Bank control signal WRT<A> is activated when a write command designating bank BK<A> is executed.

The data transmitted to data buffer 290a is transmitted to data line switch 280a. In response to write address ADDr, data line switch 280a transmits the write data transmitted from transfer data bus 251 or global write bus GWBa to a selected one of local data lines LDLa. Write address ADDw is transmitted to address buffer 295a. Data buffer 290a and address buffer 295a temporarily hold the transmitted data and address, respectively, and transmit them to data line switch 280a by a FIFO method.

Since write selection circuits 220b to 220d and transfer switches 265b to 265d corresponding to memory blocks 200b to 200d have the same structure as that of FIG. 15, detailed description thereof will not be repeated.

As shown in FIGS. 14 and 15, connection with a transfer bus is controlled according to a bank control signal which indicates whether or not a command designating a corresponding memory block is applied. As a result, the circuit structure can be simplified.

Figure 16:
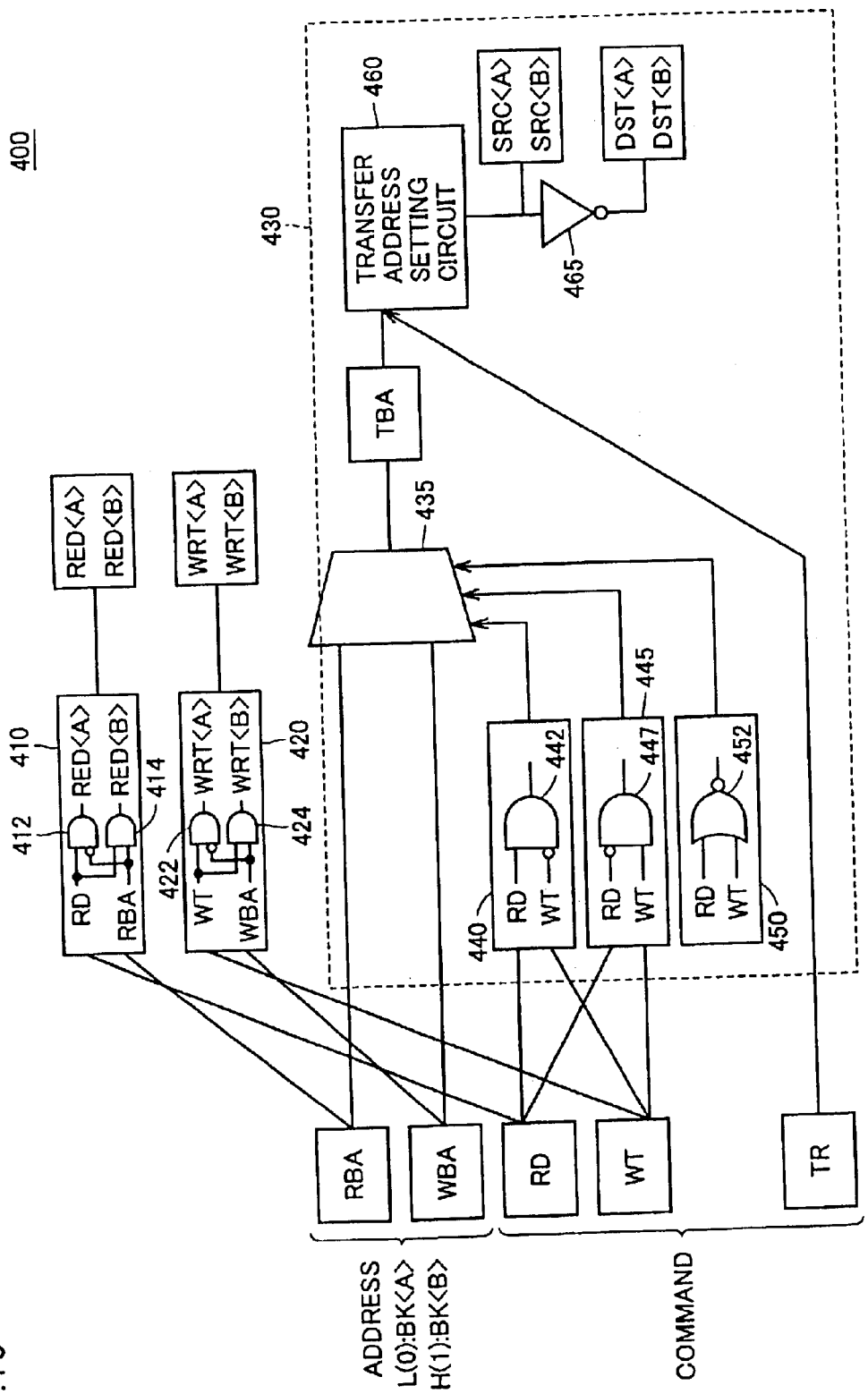
FIG. 16 is a block diagram showing the structure of a bank control circuit for generating bank control signals shown in FIGS. 14 and 15.

FIG. 16 is a block diagram of a bank control circuit for generating the bank control signals shown in FIGS. 14 and 15.

Referring to FIG. 16, bank control circuit 400 generates bank control signals RED<A>, RED<B>, WRT<A>, WRT<B>, SRC<A>, SRC<B>, DST<A>, DST<B> based on command control signals RD, WT, TR, a read bank address RBA and a write bank address WBA. Command control signals RD, WT, TR indicate input of a read command, a write command and a transfer command, respectively.

Each command control signal RD, WT, TR is activated to H level when a corresponding command is applied, and otherwise inactivated to L level. Each of read bank address RBA and write bank address WBA is set to L level ("0") when bank BK<A> is selected, and set to H level ("1") when bank BK<B> is selected.

Bank control circuit 400 includes a read command control circuit 410 for generating bank control signals RED<A>, RED<B> according to command control signal RD and read bank address RBA. Read command control circuit 410 includes logic gates 412, 414. Logic gate 412 outputs the AND operation result of command control signal RD and an inverted signal of read bank address RBA as bank control signal RED<A>. Logic gate 414 outputs the AND operation result of command control signal RD and read bank address RBA as bank control signal RED<B>.

Accordingly, read command control circuit 410 activates bank control signal RED<A> to H level when a read command designating bank BK<A> is applied, and activates bank control signal RED<B> to H level when a read command designating bank BK<B> is applied. Read command control signal 410 inactivates bank control signals RED<A>, RED<B> to L level when a read command designating a corresponding bank is not applied.

Bank control circuit 400 further includes a write command control circuit 420 for generating bank control signals WRT<A>, WRT<B> according to command control signal WT and write bank address WBA. Write command control circuit 420 includes logic gates 422, 424. Logic gate 422 outputs the AND operation result of command control signal WT and an inverted signal of write bank address WBA as bank control signal WRT<A>. Logic gate 424 outputs the AND operation result of command control signal WT and write bank address WBA as bank control signal WRT<B>.

Accordingly, write command control circuit 420 activates bank control signal WRT<A> to H level when a write command designating bank BK<A> is applied, and activates bank control signal WRT<B> to H level when a write command designating bank BK<B> is applied. Write command control signal 420 inactivates bank control signals WRT<A>, WRT<B> to L level when a write command designating a corresponding bank is not applied.

Bank control circuit 400 further includes a transfer address generating section 430. Transfer address generating section 430 includes a selector 435, and command detection circuits 440, 445, 450. Selector 435 outputs one of read bank address RBA and write bank address WBA as a transfer bank address TBA. Command detection circuits 440, 445, 450 control operation of selector 435.

Command detection circuit 440 has a logic gate 442 for outputting the AND operation result of command control signal RD and an inverted signal of command control signal WT. Accordingly, the output of command detection circuit 440 is set to H level when only a read command is detected.

Command detection circuit 445 has a logic gate 447 for outputting the AND operation result of an inverted signal of command control signal RD and command control signal WT. Accordingly, the output of command detection circuit 445 is set to H level when only a write command is detected.

Command detection circuit 450 has a logic gate 452 for outputting the NOR operation result of command control signal RD and command control signal WT. Accordingly, the output of command detection circuit 450 is set to H level when neither a read command nor a write command is detected.

When the output of command detection circuit 440 is set to H level, i.e., when only a read command is detected, data may be transferred from one bank selected for read operation to the other bank. Therefore, selector 435 outputs read bank address RBA as transfer bank address TBA. On the other hand, when the output of command detection circuit 445 is set to H level, i.e., when only a write command is detected, data may be transferred from one bank selected for write operation to the other bank. Therefore, selector 435 outputs write bank address WBA as transfer bank address TBA.

When the output of command detection circuit 450 is set to H level, i.e., when neither a read command nor a write command is detected, data may be internally transferred. Therefore, selector 435 outputs read bank address RBA as transfer bank address TBA.

Transfer address generating section 430 further includes a transfer address setting circuit 460 and an inverter 465. When a transfer command is executed, transfer address setting circuit 460 generates bank control signals SRC<A>, SRC<B> based on transfer bank address TBA from selector 435. Inverter 465 inverts bank control signals SRC<A>, SRC<B> indicating a transferring bank into bank control signals DST<A>, DST<B> indicating a transferred bank, respectively.

Accordingly, bank control signal SRC<A> is activated to H level when a transfer command designating bank BK<A> as a transferring bank is applied. Bank control signal SRC<B> is activated to H level when a transfer command designating bank BK<B> as a transferring bank is applied. Similarly, bank control signal DST<A> is activated to H level when a transfer command designating bank BK<A> as a transferred bank is applied. Bank control signal DST<B> is activated to H level when a transfer command designating bank BK<B> as a transferred bank is applied.

When a transfer command is applied, a bank control signal group designating a transferring bank and a transferred bank is thus generated based on transfer bank address TBA which is set using one of the read bank address and the write bank address. On the other hand, when a transfer command is not generated, transfer address setting circuit 460 discontinues generation of these bank control signals. In other words, transfer address setting circuit 460 inactivates bank control signals SRC<A>, SRC<B>, DST<A>, DST<B> to L level.

The above structure enables a transfer command to be executed based on a bank address for a write command and a read command without providing a port for receiving a bank address for a transfer command from the outside.

Hereinafter, operation examples of the MRAM device of the third embodiment will be described with reference to FIGS. 17 to 20.

Figure 17:
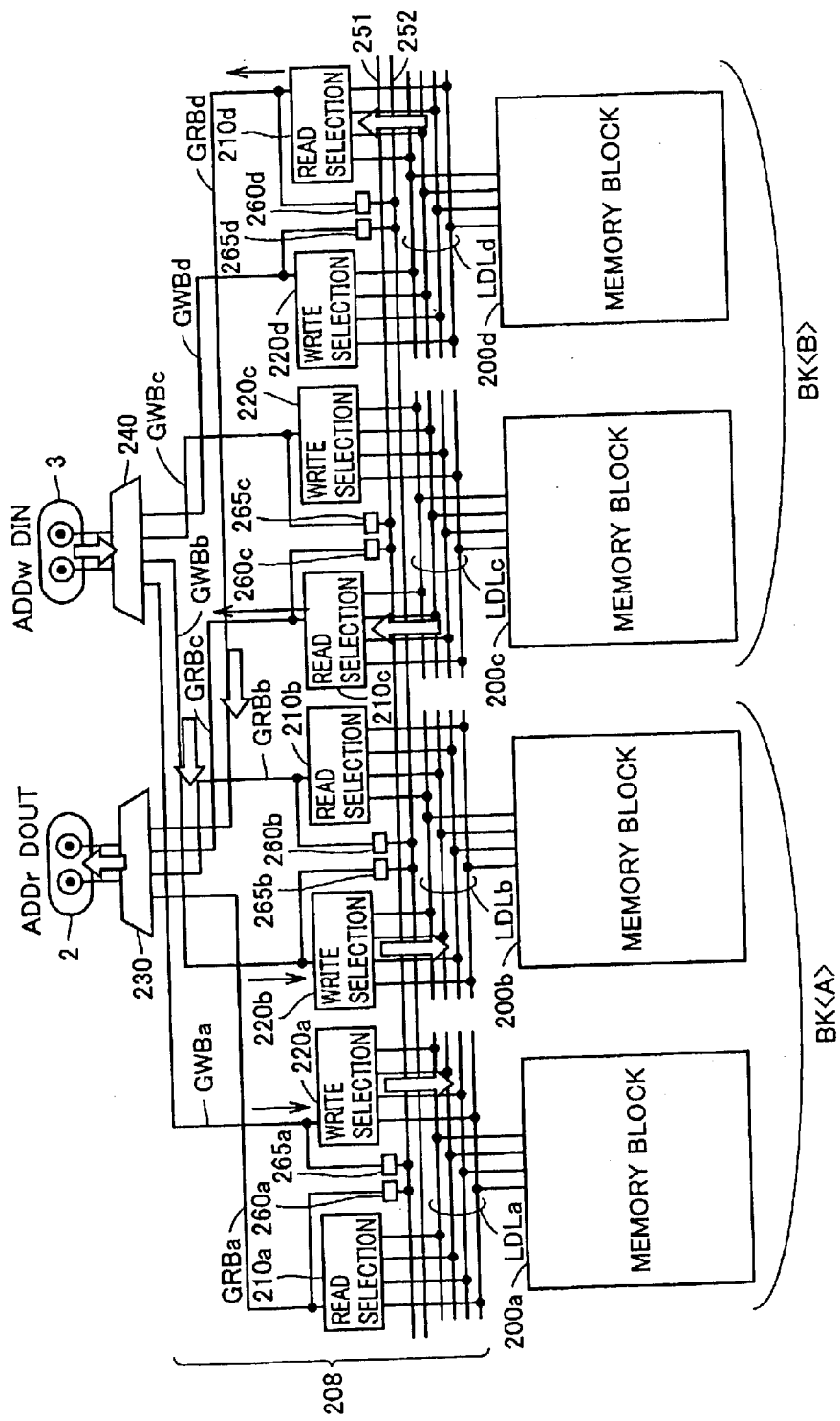
FIG. 17 is a conceptual diagram illustrating a first operation example of the MRAM device of the third embodiment.

FIG. 17 shows an example in which a write command designating bank BK<A> and a read command designating bank BK<B> are simultaneously applied.

Referring to FIG. 17, in response to the write command, input data DIN applied to write port 3 is transmitted from selector 240 to global write buses GWBa, GWBb corresponding to bank BK<A>. Input data DIN thus transmitted to global write buses GWBa, GWBb is written to memory blocks 200a, 200b through write selection circuits 220a, 220b and one of local data lines LDLa and one of local data lines LDLb which are selected according to write address ADDw, respectively.

Moreover, in response to the read command, read selection circuits 210c, 210d read data from bank BK<B> by using one of local data lines LDLc and one of local data lines LDLd which are selected according to read address ADDr. Data thus read by read selection circuits 210c, 210d is transmitted to selector 230 through global read buses GRBc, GRBd and output from read port 2.

In this way, the read command and the write command can be executed in parallel in different banks. Accordingly, concurrent processing of read and write operations can be implemented in the whole MRAM device. Especially when the time required for write operation is long, read operation from the other bank is conducted while conducting write operation to one bank. Such parallel processing enables improvement in application processing efficiency.

Figure 18:
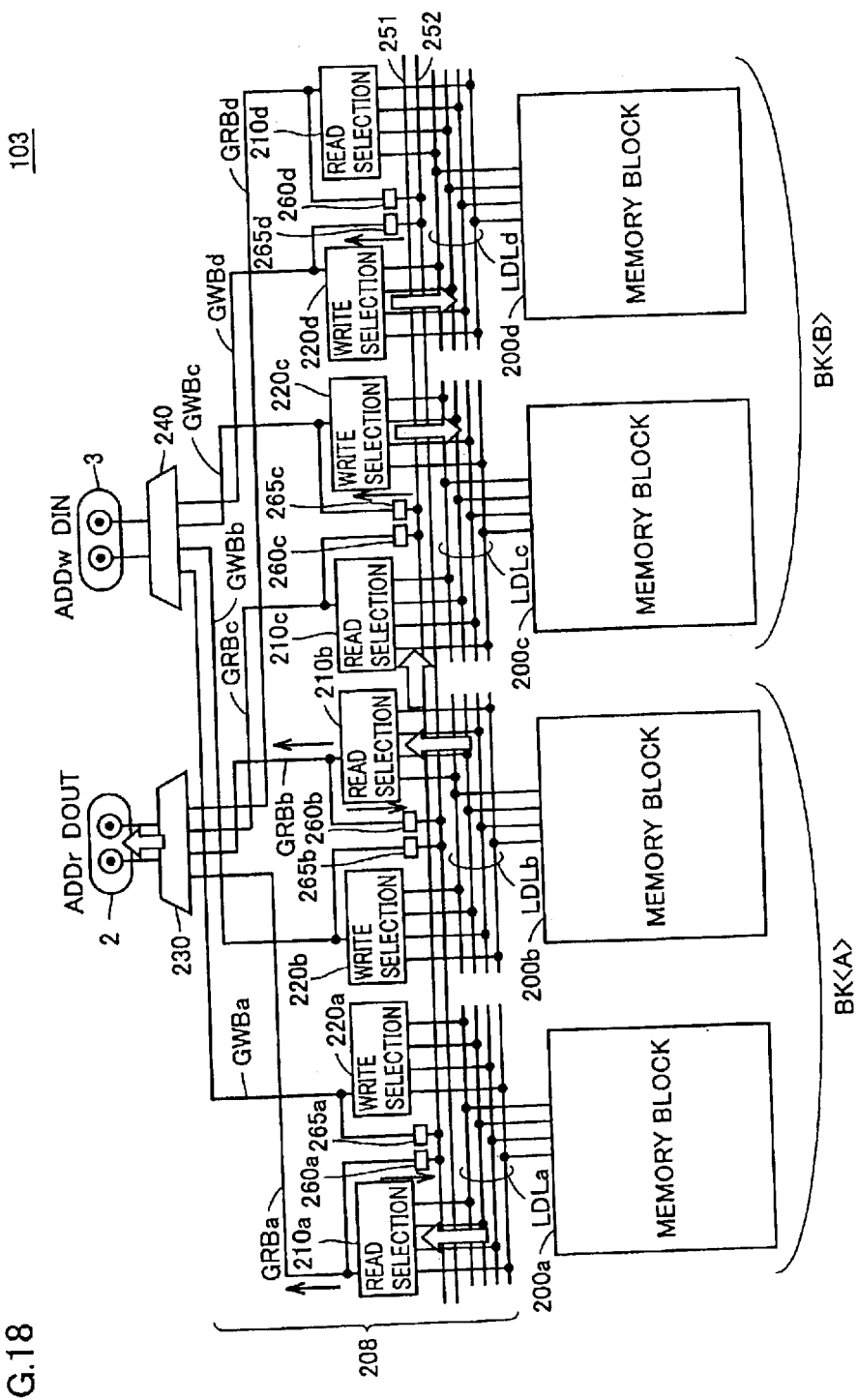
FIG. 18 is a conceptual diagram illustrating a second operation example of the MRAM device of the third embodiment.

FIG. 18 shows an example in which a read command and a transfer command are applied, and read data from one bank designated by the read command is transferred and written to the other bank.

Referring to FIG. 18, in response to a read command designating bank BK<A>, data is read from memory blocks 200a, 200b according to read address ADDr. Read selection circuits 210a, 210b transmit the read data from memory blocks 200a, 200b to global read buses GRBa, GRBb, respectively. The read data thus transmitted to global read buses GRBa, GRBb are output from read port 2 through selector 230.

In response to a transfer command, the read data output from transfer selection circuits 210a, 210b are transmitted also to transfer data buses 251, 252 through transfer switches 260a, 260b, respectively. The read data of memory block 200a thus transmitted to transfer data bus 251 is written to a memory cell of memory block 200c, i.e., a memory cell corresponding to read address ADDr, through transfer switch 265c and write selection circuit 220c.

Similarly, the read data of memory block 200b transmitted to transfer data bus 252 is written to a memory cell of memory block 200d, i.e., a memory cell corresponding to read address ADDr, through transfer switch 265d and write selection circuit 220d.

By executing the transfer command in this way, backup data can be stored with improved efficiency when one bank is used as a backup (mirror) bank of the output data to the outside.

In the above structure, read data is transmitted to a transferred bank (memory block) through a transfer data bus. Therefore, operation according to the read command will not be delayed by execution of the transfer command. Especially, data buffer 290a and address buffer 295a as shown in FIG. 15 can temporarily hold transferred read data and a corresponding address. As a result, the transferred data can be written at an appropriate timing after read operation. Therefore, read operation will not be delayed due to the transfer command.

Figure 19:
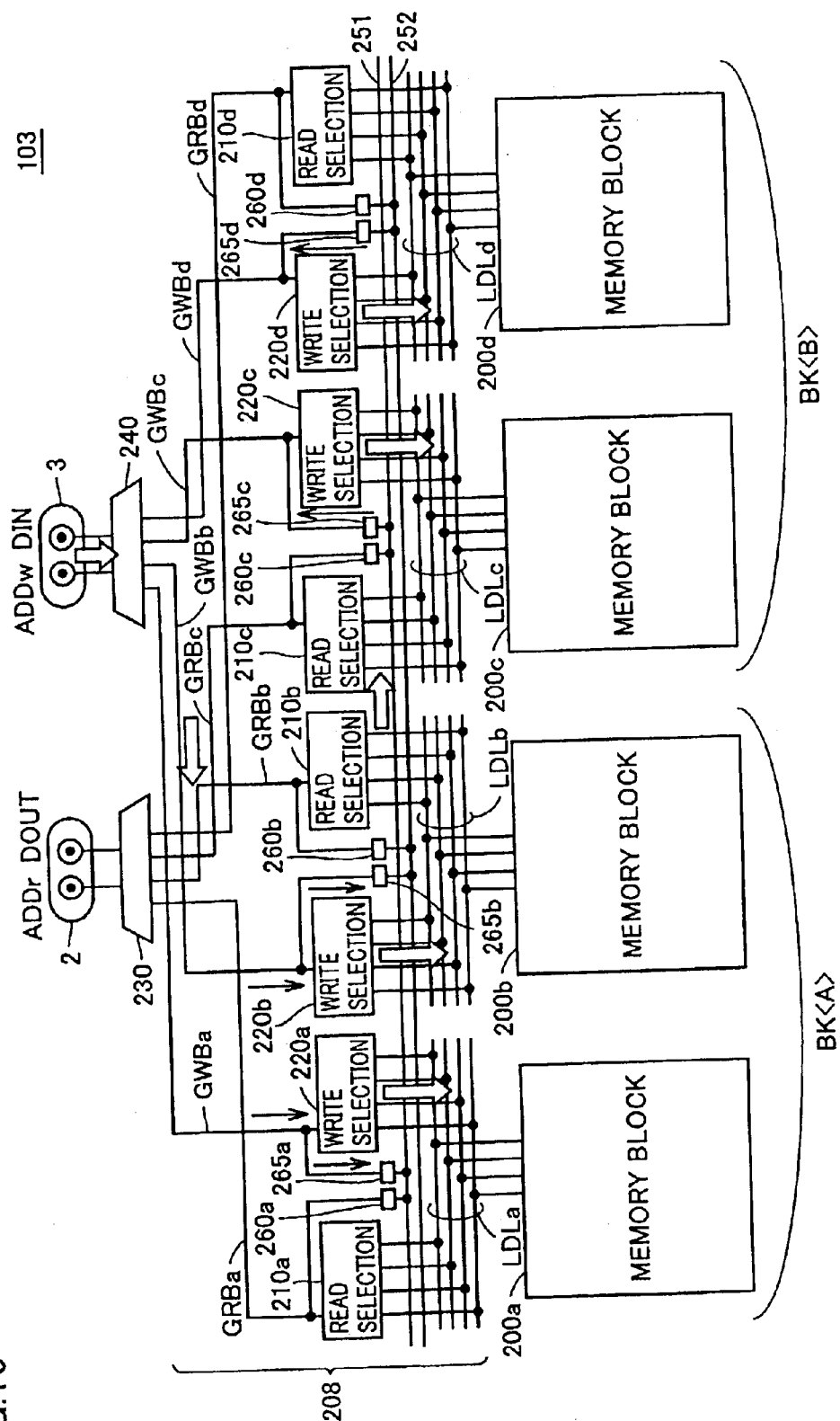
FIG. 19 is a conceptual diagram illustrating a third operation example of the MRAM device of the third embodiment.

FIG. 19 shows an example in which a write command and a transfer command are applied, and write data to one bank designated by the write command is transferred and written also to the other bank.

Referring to FIG. 19, in response to a write command designating bank BK<A>, input data DIN is written to memory blocks 200a, 200b based on write address ADDw applied to write port 3. Input data DIN is written to memory blocks 200a, 200b through selector 240, write selection circuits 220a, 220b, and one of local data lines LDLa and one of local data lines LDLb which correspond to write address ADDw, respectively.

In response to a transfer command, the input data which is transmitted to write selection circuits 220a, 220b is transmitted also to transfer data buses 251, 252 by transfer switches 265a, 265b, respectively. The write data thus transmitted to transfer data buses 251, 252 is transmitted to write selection circuits 220c, 220d through transfer switches 265c, 265d, respectively. Write selection circuits 220c, 220d write the received data to memory blocks 200c, 200d through one of local data lines LDLc and one of local data lines LDLd which correspond to write address ADDw, respectively.

Such a transfer command enables the same data to be stored in a plurality of banks. Accordingly, one bank can be used as a cache memory when data is downloaded from a server. In other words, downloaded data can be read by executing a read command to the other bank BK<B> while executing a write command to bank BK<A>. As a result, the overall operation efficiency can be improved.

Moreover, when a transferred bank is used as a backup (mirror) bank, the backup data can be-efficiently updated.

Figure 20:
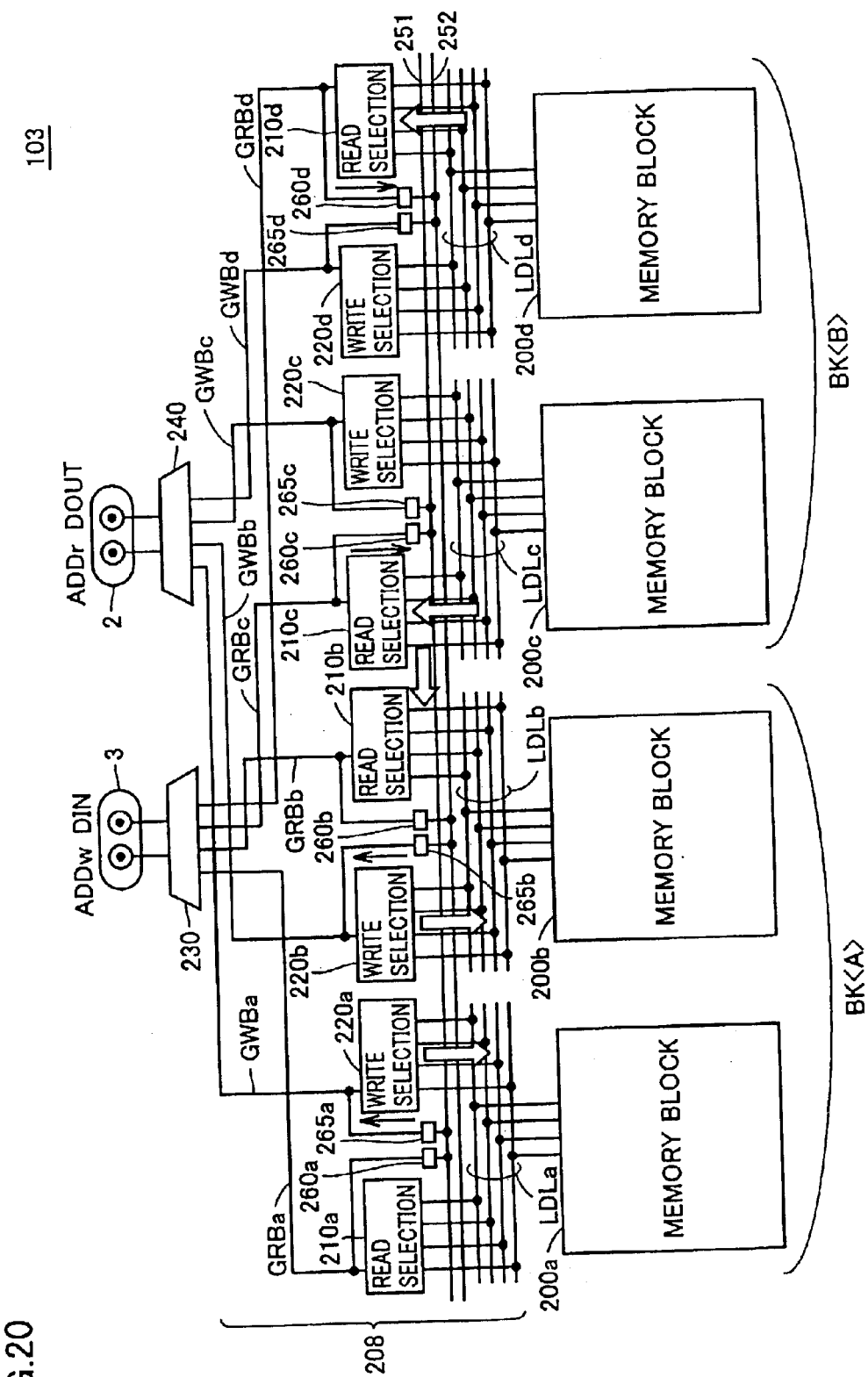
FIG. 20 is a conceptual diagram illustrating a fourth operation example of the MRAM device of the third embodiment.

FIG. 20 shows an example in which only a transfer command is applied and data is transferred within the MRAM device without affecting the external operation.

Referring to FIG. 20, read data from memory blocks 200c, 200d of bank BK<B> is transmitted from read selection circuits 210c, 210d to transfer data buses 251, 252 through transfer switches 260c, 260d, respectively. The data thus transmitted to transfer data buses 251, 252 is transmitted to write selection circuits 220a, 220b by transfer switches 265a, 265b, respectively. As described before, when only a transfer command is applied, bank control signals designating a transferring bank and a transferred bank are generated based on read address ADDr applied to read port 2.

Write selection circuits 220a, 220b write the received data to a memory cell of memory block 200a and a memory cell of memory block 200b, i.e., memory cells corresponding to read address ADDr, through a selected one of local data lines LDLa and a selected one of local data lines LDLb, respectively.

In this way, even when neither a read command nor a write command is applied from the outside, applying a transfer command enables read data from one bank to be written to the other bank without outputting the read data from the read port to the outside. By such a transfer command, the read data from one bank can be transferred to the other bank in advance, whereby the other bank can be operated as a backup (mirror) bank. In particular, since such a transfer command can be executed without using an external bus, another device connected to the external bus can be operated in parallel.

Moreover, data transfer between internal banks is conducted before read data is output to the outside or write data is input from the outside. As a result, mirror data held in a bank operating as a backup bank can be updated efficiently.

As has been described above, the MRAM device of the third embodiment is formed by memory blocks each capable of conducting only one of read operation and write operation. However, concurrent processing of read and write operations can be implemented by improving the structure of the peripheral interface circuitry and independently providing a read port and a write port. Moreover, by executing a transfer command using internal transfer data buses, backup data can be efficiently held and updated in the MRAM device having a plurality of memory blocks.

In the third embodiment, the number of bits to be read and written in each memory block is one (N=1). However, N may be two or more. In this case, it is necessary to provide N transfer data buses 251 and N transfer data buses 252 (FIG. 13) as well as N corresponding transfer switches 260a, 260b, 260c, 260d and N corresponding transfer switches 265a, 265b, 265c, 265d. Especially when the number of local data lines (LDLa, LDLb, LDLc, LDLd) per memory block is designed to match the number of bits N, the function to select a local data line as shown in FIGS. 14 and 15 is not required. As a result, the circuit structure is simplified.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device comprising:
    a memory cell array including a plurality of magnetic memory cells each holding magnetically written storage data;
    a first port for receiving a write address indicating a write selected memory cell which is selected for write operation in said memory cell array, and write data to said write selected memory cell;
    a second port for receiving a read address indicating a read selected memory cell which is selected for read operation in said memory cell array, and outputting read data from said read selected memory cell; and
    peripheral circuitry for conducting read operation and write operation in parallel in said memory cell array based on said read address and said write address, respectively, wherein
    said plurality of magnetic memory cells are arranged in a matrix,
    said memory cell array further includes
        a plurality of read selection lines and a plurality of write selection lines which are provided corresponding to memory cell rows, and
        a plurality of bit lines provided corresponding to memory cell columns, and
    said peripheral circuitry includes
        a first decode circuit for selectively activating said plurality of read selection lines according to said read address,
        a second decode circuit for selectively activating said plurality of write selection lines according to said write address,
        a data read circuit for reading said storage data from said read selected memory cell by using one of said plurality of bit lines which is selected according to said read address, and
        a data write circuit for writing said write data to said write selected memory cell by using one of said plurality of bit lines which is selected according to said write address.

2. The thin film magnetic memory device according to claim 1, wherein
    said peripheral circuitry further includes a latch circuit for temporarily holding said write data as latch data until said write data is written to said write selected memory cell by said data write circuit,
    when said read selected memory cell and said write selected memory cell are selected in parallel and correspond to the same bit line, said data write circuit postpones write operation to said write selected memory cell to a later cycle, and
    said peripheral circuitry further includes a transfer circuit for outputting said latch data held in said latch circuit from said second port as said read data when an address corresponding to said latch data is designated by said read addresses.

3. The thin film magnetic memory device according to claim 1, wherein
    said data write circuit supplies a first data write current corresponding to said write data to one of said plurality of bit lines which is selected according to said write address,
    each of said plurality of write selection lines receives a second data write current of a predetermined direction when activated, and
    said data write circuit starts supplying said first data write current after said second data write current starts being supplied to the write selection line corresponding to said write address, and completes supply of said first data write current before said supply of said second data write current is completed.

4. A thin film magnetic device comprising:
    a memory cell array including a plurality of magnetic memory cells each holding magnetically written storage data;
    a first port for receiving a write address indicating a write selected memory cell which is selected for write operation in said memory cell array, and write data to said write selected memory cell;
    a second port for receiving a read address indicating a read selected memory cell which is selected for read operation in said memory cell array, and outputting read data from said read selected memory cell; and
    peripheral circuitry for conducting read operation and write operation in parallel in said memory cell array based on said read address and said write address, respectively, wherein
    said memory cell array is divided into a plurality of banks,
    each of said plurality of banks is capable of independently conducting said read operation or said write operation, and
    said peripheral circuitry conducts said read operation from one of said plurality of banks and said write operation to another one of said plurality of banks in parallel.

5. A thin film magnetic memory device, comprising:
    a memory cell array including a plurality of magnetic memory cells arranged in a matrix, each of said plurality of magnetic memory cells holding magnetically written storage data, wherein
    said memory cell array further includes
        a plurality of read selection lines and a plurality of write selection lines which are provided corresponding to memory cell rows, a plurality of read bit lines provided corresponding to memory cell columns, and each electrically coupled to magnetic memory cells of corresponding one of said memory cell columns, and a plurality of write bit lines provided corresponding to said memory cell columns, and each not being electrically coupled to said plurality of magnetic memory cells, said thin film magnetic memory device further comprising:

a first port for receiving a write address indicating a write selected memory cell which is selected for write operation in said memory cell array, and write data to said write selected memory cell;

a second port for receiving a read address indicating a read selected memory cell which is selected for read operation in said memory cell array, and outputting read data from said read selected memory cell; and peripheral circuitry for conducting read operation and write operation in parallel in said memory cell array based on said read address and write address, respectively, wherein said peripheral circuitry includes a data read circuit for reading said storage data from said read selected memory cell by using at least one of said plurality of read bit lines which is selected according to said read address, and a data write circuit for writing said write data to said write selected memory cell by using at least one of said plurality of write bit lines which is selected according to said write address.

6. The thin film magnetic memory device according to claim 5, wherein said peripheral circuitry further includes a first decode circuit for selectively activating said plurality of read selection lines according to said read address, and a second decode circuit for selectively activating said plurality of write selection lines according to said write address.

7. The thin film magnetic memory device according to claim 5, wherein said data write circuit supplies a data write current corresponding to said write data to one of said plurality of write bit lines which corresponds to said write selected memory cell, and fixes each of the remaining write bit lines to a predetermined voltage.

8. The thin film magnetic memory device according to claim 5, wherein a distance between each of said plurality of memory cells and corresponding one of said plurality of write bit lines is shorter than a distance between each of said plurality of memory cells and corresponding one of said plurality of read bit lines.

9. A thin film magnetic memory device, comprising:

a plurality of memory blocks each including a plurality of magnetic memory cells arranged in a matrix, each of said plurality of magnetic memory cells holding magnetically written storage data, wherein each of said plurality of memory blocks is capable of independently conducting read operation or write operation, said thin film magnetic memory device further comprising:

a first port for receiving write data and a write address indicating a write selected memory cell to which said write data is to be written in said memory cell array;

a second port for receiving a read address indicating a read selected memory cell which is selected for read operation in said memory cell array, and outputting read data from said read selected memory cell; and peripheral circuitry provided between said first and second ports and said plurality of memory blocks, for controlling said read operation and said write operation in said plurality of memory blocks, wherein said peripheral circuitry includes a transfer circuit for writing said read data or said write data corresponding to one of said plurality of memory blocks to another one of said plurality of memory blocks in response to a transfer command.

10. The thin film magnetic memory device according to claim 9, wherein said peripheral circuitry further includes a plurality of read buses provided corresponding to said plurality of memory blocks, and each transmitting said read data from corresponding one of said memory blocks, a plurality of write buses provided corresponding to said plurality of memory blocks, and each transmitting said write data to corresponding one of said memory blocks, a first selector for selectively transmitting said write data from said first port to said plurality of write buses according to said write address, and a second selector for selectively transmitting said read data from said plurality of read buses to said second port according to said read address, and said transfer circuit includes a transfer bus for transmitting data between two memory blocks selected according to one of said read address and said write address.

11. The thin film magnetic memory device according to claim 10, wherein each of said plurality of memory blocks is connected to another one of said plurality of memory blocks through said transfer bus, and said peripheral circuitry further includes a plurality of data read circuits and a plurality of data write circuits provided corresponding to said plurality of memory blocks, a plurality of first transfer switch sections provided corresponding to said plurality of memory blocks, and each controlling connection between corresponding one of said data read circuits and corresponding one of said read buses and said transfer bus according to whether or not a read command and said transfer command from corresponding one of said memory blocks are applied, and a plurality of second transfer switch sections provided corresponding to said plurality of memory blocks, and each controlling connection between corresponding one of said data write circuits and corresponding one of said write buses and said transfer bus according to whether or not a write command and said transfer command to corresponding one of said memory blocks are applied.

12. The thin film magnetic memory device according to claim 9, wherein said peripheral circuitry further includes a transfer control circuit for designating the memory block to which data is to be transferred as a transferred memory block or the memory block from which data is to be transferred as a transferring memory block, when said transfer command is executed, and said transfer control circuit designates one of the memory block corresponding to said read selected memory cell and the memory block corresponding to said write selected memory cell as said transferring memory block according to whether or not said write operation and said read operation are conducted in parallel with said transfer command.

\* \* \* \* \*